(12) United States Patent
Motz et al.

(10) Patent No.: US 12,163,808 B2
(45) Date of Patent: Dec. 10, 2024

(54) HYBRID HIGH-BANDWIDTH MAGNETIC FIELD SENSOR

(71) Applicant: Infineon Technologies AG, Neubiberg (DE)

(72) Inventors: Mario Motz, Wernberg (AT); Amirhossein Jouyaeian, The Hague (NL); Kofi Makinwa, San Jose, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/519,430

(22) Filed: Nov. 27, 2023

(65) Prior Publication Data

US 2024/0085217 A1  Mar. 14, 2024

Related U.S. Application Data

(63) Continuation of application No. 17/713,701, filed on Apr. 5, 2022, now Pat. No. 11,828,625.

(51) Int. Cl.
*G01R 33/09* (2006.01)
*G01D 5/14* (2006.01)
*H03M 3/00* (2006.01)

(52) U.S. Cl.
CPC ............. *G01D 5/145* (2013.01); *G01R 33/09* (2013.01); *H03M 3/368* (2013.01); *H03M 3/458* (2013.01)

(58) Field of Classification Search
CPC ...... G01R 33/09; H03M 3/368; H03M 3/458; G01D 5/145
See application file for complete search history.

(56) References Cited

U.S. PATENT DOCUMENTS

| 5,334,944 | A | * | 8/1994 | Hirakata | ............. H03F 3/45479 330/6 |
| 11,828,625 | B2 | | 11/2023 | Motz | |
| 2009/0096302 | A1 | | 4/2009 | Barada et al. | |
| 2023/0314176 | A1 | | 10/2023 | Motz et al. | |

* cited by examiner

*Primary Examiner* — Alesa Allgood
(74) *Attorney, Agent, or Firm* — Banner & Witcoff Ltd.

(57) ABSTRACT

The described techniques address issues associated with hybrid current or magnetic field sensors used to detect both low- and high-frequency magnetic field components. The hybrid sensor implements a DC component rejection path in the high-frequency magnetic field component path. Both digital and analog implementations are provided, each functioning to generate a DC component cancellation signal to at least partially cancel a DC component of a current signal generated via the high-frequency magnetic field component path. The hybrid sensor provides a high-bandwidth, high-accuracy, and low DC offset hybrid current solution that also eliminates the need for DC decoupling capacitors in the high-frequency path. A modification is also described for implementing a Sigma-Delta (ΣΔ) quantization noise reduction path to reduce the quantization noise and to improve accuracy.

20 Claims, 24 Drawing Sheets

Double input stage stage of an a GM-C integrator for a ΣΔ-ADC with voltage input for signal using source degenerating resistor and current input for offset correction
$\Delta I \approx \Delta V / R_{sense}$ Simple input stage of an integrator for a ΣΔ-ADC: differential pair $\Delta V \rightarrow \Delta I$ conversion
$\Delta I \approx \Delta V \times Gm$ Simple input stage of an amplifier: differential pair $\Delta V \rightarrow \Delta I$ conversion $\Delta I = \Delta V \cdot G_m$ Double input stage stage of an amplifier with voltage input for signal using source degenerating resistor and current input for offset correction $\Delta I \approx \Delta V / R_{sense}$

HYBRID HIGH-BANDWIDTH MAGNETIC FIELD SENSOR

CROSS-REFERENCE TO RELATED APPLICATIONS

This application is a continuation of and claims priority to U.S. patent application Ser. No. 17/713,701, filed Apr. 5, 2022, and issued as U.S. Pat. No. 11,828,625 on Nov. 28, 2023, the contents of which are hereby incorporated by reference in their entirety.

TECHNICAL FIELD

The aspects described herein generally relate to magnetic field sensors or magnetic field sensor systems and, more particularly, to magnetic field sensors that utilize a high-bandwidth architecture implementing a direct current (DC) component rejection path.

BACKGROUND

Magnetic field sensors typically operate by measuring a current and utilizing known relationships between the measured current and the resulting magnetic field to derive the amplitude and direction of the magnetic field. For some magnetic field sensor applications, it is desirable to sense both high-frequency and low-frequency magnetic field components (i.e. magnetic frequencies within respective high- and low-frequency ranges). A common way to perform such measurements is via the use of so-called "hybrid" current sensors, which implement different types of architectures to respectively measure both the high- and the low-frequency magnetic field components. However, conventional hybrid current sensors have various drawbacks.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

The example aspects of the present disclosure will be described with reference to the accompanying drawings. The drawing in which an element first appears is typically indicated by the leftmost digit(s) in the corresponding reference number.

SUMMARY

Figure 1:
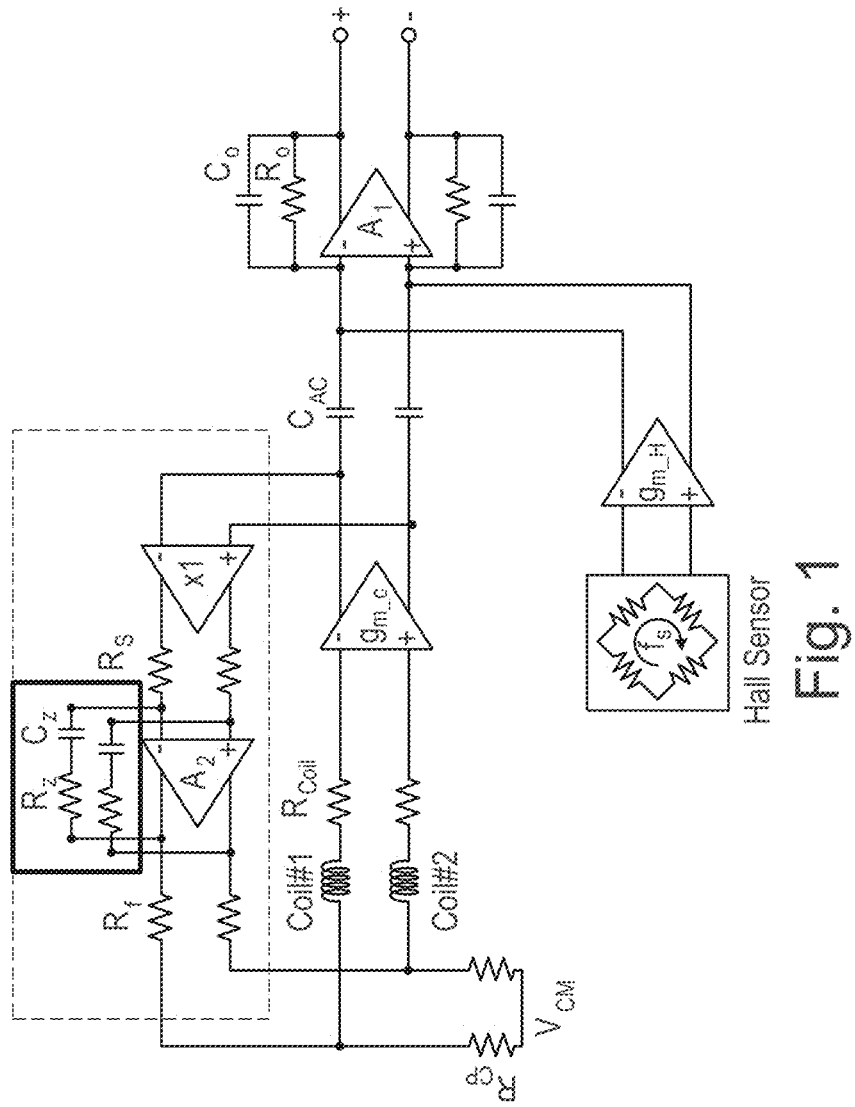
FIG. 1 illustrates a conventional hybrid magnetic field sensor configuration.

Hybrid current sensors are implemented for applications requiring a high bandwidth, although existing hybrid current sensors used to measure both high- and low-frequency magnetic field components have drawbacks. This stems from the limitations of low-frequency current sensing architectures to accurately measure fast-switching currents that result in high-frequency magnetic field components. For instance, and as shown in FIG. 1, such hybrid current sensors may implement Hall sensor elements for detecting DC and low-frequency magnetic field components, and coil-based sensors for detecting AC or high-frequency magnetic field components. Hall sensors are particularly useful for the measurement of DC and low-frequency magnetic field components, as such sensors have a low DC offset and low zero point error. Coil-based sensors, on the other hand, provide measurements with low noise, but fail to measure lower frequency magnetic field components, i.e. slowly switching magnetic fields.

Thus, conventional hybrid magnetic field sensors as shown in FIG. 1 function to combine two separate magnetic field measurement paths to ensure that high-bandwidth measurement requirements are met. It is noted that because hybrid current sensors function to measure magnetic fields, the terms "hybrid current sensor" and "hybrid magnetic field sensor" are used interchangeably herein.

To do so, the transconductance amplifier $g_{m\_C}$ receives a differential voltage signal from the coil-based sensor (i.e. coils #1 and #2), which functions as a pre-amplifier to output a differential current signal that is identified with the AC or high-frequency magnetic field components measured via the coil-based sensor. Another transconductance amplifier $g_{m\_H}$ receives a differential voltage signal from the Hall sensor, and likewise functions as a pre-amplifier to output a differential current signal that is identified with the DC or low-frequency magnetic field components measured via the Hall sensor. A transimpedance output amplifier $A_1$ functions to amplify a summation of the differential current signals respectively output via the transconductance amplifiers $g_{m\_C}$, $g_{m\_H}$ and to output a differential voltage signal. In this way, the conventional hybrid magnetic field sensor (also referred to as a current sensor) outputs a differential voltage signal that represents a summation of the AC or high-frequency magnetic field components measured via the coil-based sensor and the DC or low-frequency magnetic field components measured via the Hall sensor.

However, such conventional hybrid magnetic field sensors require DC decoupling capacitors CAC between the input of the transimpedance output amplifier $A_1$ and the output of transconductance amplifiers $g_{m\_C}$ to isolate the high-frequency current sensor from the effects of the low-frequency sensors, which will otherwise introduce unwanted noise and a DC offset into the high-frequency magnetic field component measurements. These DC decoupling capacitors take up a large area of valuable chip space. Moreover, the high-frequency magnetic field component path may implement a DC servo loop as shown in FIG. 1 in the dashed box, which includes off-chip components, thereby introducing additional cost and wiring complexity into the sensor design. Finally, the use of DC servo loops in conventional hybrid magnetic field sensors presents bandwidth limitations, and thus is unsuitable for applications that require bandwidths exceeding 1 MHz.

The embodiments as described herein address the issues associated with conventional hybrid current sensors by implementing a direct current (DC) component rejection path that is coupled to a high-frequency magnetic field component path, which is also referred to herein as an AC magnetic field component sensor path. However, unlike conventional DC servo loops, the DC component rejection path in accordance with the embodiments as described herein may implement digital- or analog-based solutions. Moreover, the digital-based solutions may implement a Continuous-Time Sigma-Delta Analog-to-Digital Converter (CT-EA ADC) coupled with a digital integrator and a digital-to-analog converter (DAC) to generate a digital representation of a DC component cancellation signal, which is then converted to an analog signal. The analog signal may be provided in the form of a voltage or a current signal, which is coupled to the AC magnetic field component sensor path to cancel or at least partially remove the DC components (e.g. DC offsets). A modification is also described herein for implementing a quantization noise reduction path as part of the DC component rejection path to further reduce quantization noise and improve sensor accuracy.

The analog-based embodiments may utilize a DC component rejection path that implements analog components that function to perform integration of a signal that is generated in response to the current signal output by a pre-amplifier in the AC magnetic field component sensor path to generate a DC component cancellation signal. The DC component cancellation signal may be provided in the form of a voltage or a current signal, which is coupled to the AC magnetic field component sensor path to cancel or at least partially remove the DC components (e.g. DC offsets).

For both the digital- and analog-based solutions, the embodiments discussed in further detail herein enable a high-bandwidth, high-accuracy, and low DC offset hybrid current solution that also eliminates the need for DC decoupling capacitors. Moreover, the digital- and analog-based embodiments may comprise an AC magnetic field component path implementing an XMR sensor or other suitable components such as vertical coils, and a DC magnetic field component path that implements vertical Hall sensor elements or other suitable Hall elements. When the XMR sensor and vertical Hall sensor are used in combination, the digital- or analog-based DC component rejection path may be optional, and due to the enhanced bandwidth this configuration provides, the aforementioned DC blocking capacitors may alternatively be implemented.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Figure 2A:
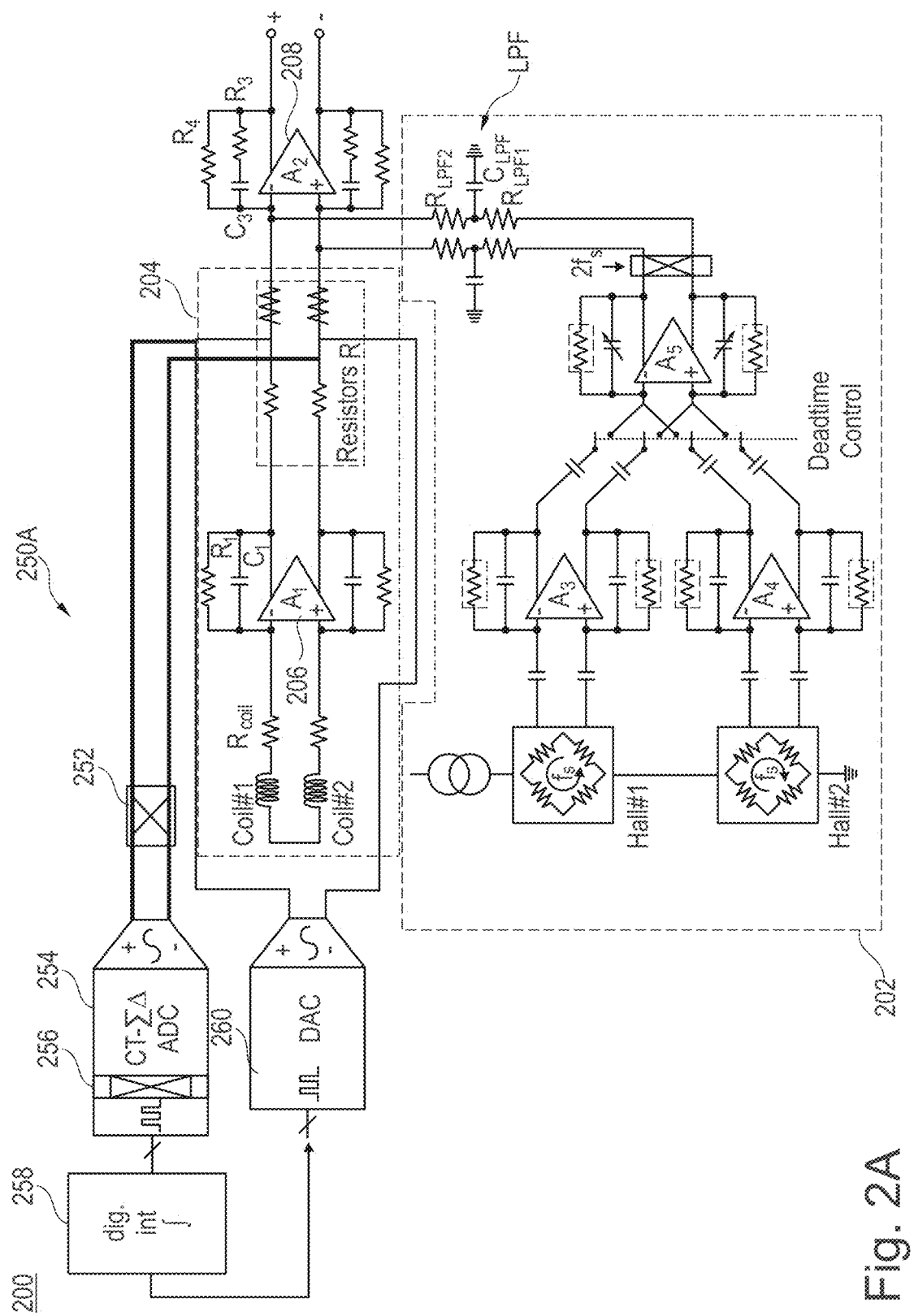
FIG. 2A illustrates an example hybrid magnetic field sensor configurations implementing a digital-based DC component rejection path, in accordance with an embodiment of the disclosure.

I. Hybrid Magnetic Field Sensor Configurations Implementing a Digital-Based DC Component Rejection Path FIG. 2A illustrates an example hybrid magnetic field sensor configuration, in accordance with an embodiment of the disclosure. As shown in FIG. 2A, the hybrid magnetic field sensor 200 includes a direct current (DC) magnetic field component sensor path 202, an alternating current (AC) magnetic field component sensor path 204, and a DC component rejection path 250A.

Although referred to herein as a DC magnetic field component sensor path, the DC magnetic field component sensor path 202 may be configured to measure magnetic field components within any suitable range of frequencies, which may include DC and/or low frequency magnetic field components with respect to the sensor measurements provided by the respectively coupled sensors as shown in FIG. 2A. The DC magnetic field component sensor path 202 may be coupled to any suitable number and/or type of magnetic field sensor elements for this purpose (e.g. the Hall sensor elements as shown in FIG. 2A) that generate DC sensor signals corresponding to magnetic field measurements within a particular frequency range. Thus, the DC magnetic field component sensor path 202 may be configured to output differential current signals that represent (e.g. are proportional to) the magnetic fields sensed via any suitable number of the coupled magnetic field sensor elements having any suitable range of frequencies that are less than a predetermined threshold frequency. The DC magnetic field component sensor path 202 may include a low pass filter (LPF) as shown in FIG. 2A, which provides a frequency response based upon the operating bandwidth of the DC magnetic field component sensor path 202. The DC magnetic field component sensor path 202 may be implemented in accordance with any suitable configuration of components and/or sensor elements, such as known designs and/or the configuration as shown in FIG. 2A. As the operation of such DC magnetic field component sensor paths is generally known, a further explanation of the operation of the DC magnetic field component sensor path 202 is not provided for purposes of brevity.

The embodiments as further discussed herein are primarily directed to the use of the AC magnetic field component sensor path 204 and the DC component rejection path 250A. The AC magnetic field component sensor path 204 is configured to perform magnetic field measurements by generating any suitable signal (e.g. a voltage or current signal) that is based upon a magnetic field component measured via the coupled sensor element(s). The frequency range of magnetic field component measurements performed by the AC magnetic field component sensor path 204 may be within any suitable range of frequencies that are higher than the range of magnetic field component frequencies measured via the DC magnetic field component sensor path 202. In other words, the DC magnetic field component sensor path 202 is configured to measure magnetic fields within a range of frequencies between DC and some threshold upper frequency threshold (i.e. the low-frequency or DC magnetic field components). The AC magnetic field component sensor path 202 is configured to measure magnetic fields within a range of frequencies from an upper frequency threshold down to a lower frequency threshold, which is higher than DC (i.e. the high-frequency or "AC" magnetic field components).

For example, the AC magnetic field component sensor path 204 may include any suitable number and/or type of magnetic field component sensor elements, such as the coil sensor elements as shown in FIG. 2A for instance. The coil sensor elements (coil #1 and coil #2 as shown in FIG. 2A) are configured to generate an induced differential voltage and/or current signal in response to exposure to a time-varying magnetic field. Such coil sensors are particularly advantageous for performing higher-frequency magnetic field component measurements, although the use of coil sensor elements is by way of example and not limitation. In the example hybrid magnetic field sensor configuration 200 as shown in FIG. 2A, the coil sensor elements are coupled to a pre-amplifier 206 ($A_1$) via the coil resistors $R_{coil}$. In this example, the coil resistors function to convert the induced current generated via the coil sensor element to a corresponding differential voltage signal. The pre-amplifier 206 in this example is configured as a transconductance amplifier, although this is by way of example and not limitation as will be discussed further herein. Thus, in the present example, the pre-amplifier 206 is configured to output a current signal (e.g. a differential current signal) based upon a received AC sensor signal (i.e. the differential voltage signal provided by the sensor coil elements in this example) for magnetic field component measurements within a particular frequency range, as noted above.

The hybrid magnetic field sensor 200 also includes an output amplifier 208 which, in this example, is configured as a transimpedance amplifier that receives the differential current signal output via the pre-amplifier 206 and outputs a voltage signal (e.g. a differential voltage signal as shown in FIG. 2A). The voltage signal output by the output amplifier 208 may thus represent a differential voltage signal that is generated in response to a summation of the differential current signals output via each of the AC magnetic field component sensor path 204 and the DC magnetic field component sensor path 202. In some embodiments, the DC magnetic field component sensor path 202 may not be implemented, e.g. when DC and/or low frequency magnetic field component measurements are not needed. In such a case, the hybrid magnetic field sensor 200 may be alternatively referred to simply as a magnetic field sensor, and the output amplifier 208 may generate the corresponding signal (e.g. a differential voltage signal) in response to only the signals output via the AC magnetic field component sensor path 204.

In any event, and referring back to FIG. 1, the pre-amplifier 206 is conventionally decoupled from the output amplifier 208 using DC decoupling capacitors. This is because any DC offset introduced via the pre-amplifier 206 will otherwise be coupled to the output amplifier 208, thereby influencing the accuracy of the corresponding magnetic field measurements. The embodiments as further discussed herein eliminate the need for such decoupling capacitors and other external components via the use of the DC component rejection path 250A. As will be discussed in further detail herein, the DC component rejection path 250A may be implemented in various ways using different combinations of components, and may be coupled to different stages (e.g. nodes) of the AC magnetic field component sensor path 204 in various configurations. For instance, and with reference to FIG. 2A, the DC component rejection path 250A includes an input and an output, each being coupled to the same stage (i.e. the output stage in this example) of the AC magnetic field component sensor path 204 (i.e. at the output of the pre-amplifier 206). However, in other embodiments, which are further discussed below, the input and the output of the DC component rejection path 250A may alternatively be coupled to different respective stages within the AC magnetic field component sensor path 204, or to a common stage that is different than the stage as shown in FIG. 2A (e.g. to the input of the pre-amplifier 206).

Regardless of the particular configuration and/or coupling of the DC component rejection path 250A to the AC magnetic field component sensor path 204, the DC component rejection path 250A enables a cancellation or at least a reduction in DC magnetic field component measurements (e.g. DC offsets) that may otherwise be present in the AC magnetic field component sensor path 204. With continued reference to FIG. 2A, the DC component rejection path 250A functions to continuously average the current signal output via the pre-amplifier 206 over time to generate a DC component cancellation signal. To do so, in the present example the input of the DC component rejection path 250A is coupled to the output of the pre-amplifier 206 via the set of resistors R, as shown in FIG. 2A. The differential voltage signal output via the pre-amplifier 206 is thus converted to a differential current signal across the set of resistors R, which is proportional to the differential-voltage signal, and which is time-averaged by the DC component rejection path 250

Thus, for ideal or purely AC magnetic field component measurements, the result of continuously time-averaging of the current signal output via the pre-amplifier 206 (i.e. by time-averaging the proportional differential voltage signal) will be zero. However, if the current signal output via the pre-amplifier 206 does include a DC component (e.g. a DC offset), then the DC component cancellation signal will represent such DC components, which are coupled back into the AC magnetic field component sensor path 204 having an opposite polarity to at least partially cancel the DC component of the current signal output via the pre-amplifier 206, excepting for the delays of the DC component rejection path 250. In other words, the DC component rejection path 250A functions as a type of low-pass filter to "extract" the DC components that may be present in the current signal output via the pre-amplifier 206, which are then polarity-reversed and combined with the current signal to remove the DC components from the current signal prior to being coupled to the output amplifier 208. In this way, the DC component rejection path 250A facilitates at least a partial removal of DC components that would otherwise be passed to the output amplifier 208 without the use of decoupling capacitors.

To do so, and as illustrated in the example shown in FIG. 2A, the DC component rejection path 250A comprises a chopper switch 252, a continuous time sigma-delta (CT-ΣΔ) analog-to-digital converter (ADC) 254, a multiplier block 256, digital integration circuitry 258, and a digital-to-analog converter (DAC) 260.

The chopper switch 252 may be implemented in accordance with any suitable components, including known configurations, which function to alternatingly switch the coupling of the differential voltage signal (as a result of the differential current signal output via the pre-amplifier 206) between a first state and a second state. The first state represents the differential voltage signal lines being coupled straight across the chopper switch 252, whereas the second state represents the differential voltage signal lines being cross-coupled to one another. The chopper switch 252 is thus driven at any suitable frequency to alternate the coupling of the differential voltage signal lines in this way. In doing so, the chopper switch 252 functions to cancel or to at least further reduce any DC offset caused by the input stage of the CT-ΣΔ ADC 254.

Although FIG. 2A shows the chopper switch 252, this is by way of example and not limitation. The embodiments as described herein may implement any suitable components to couple the signal output via the pre-amplifier 206 to the input stage of the CT-ΣΔ ADC 254 to cancel or otherwise reduce the DC offset that may otherwise be caused via the input stage of the CT-ΣΔ ADC 254. Some examples of such alternative components that may be used for this purpose include auto-zeroing or correlated double sampling mechanisms.

The CT-ΣΔ ADC 254 may be implemented as any suitable type of CT-ΣΔ ADC, including known designs and configurations, and may have any suitable multi-bit resolution (e.g. 6 bits, 8 bits, 10 bits, 12 bits, etc.). The CT-ΣΔ ADC 254 is a specialized type of ADC that is an oversampling ADC, which functions to sample an input signal at a higher rate (often orders higher) than the Nyquist rate. For a CT-ΣΔ ADC, input sampling occurs just before the quantizer, which is in contrast with discreet time ΣΔ ADCs. The embodiments described herein may advantageously implement the CT-ΣΔ ADC 254 to perform a continuous-time averaging of the current signal output via the pre-amplifier 206 by way of the received input signal, which is a "chopped" version of a voltage signal that is proportional to the differential current signal that is output by the pre-amplifier 206 in this example. Thus, the CT-ΣΔ ADC 254 performs continuous-time averaging for any signal received at its input at any time, regardless of the signal shape.

The CT-ΣΔ ADC 254 thus generates digital data as a data stream of 1-bit values or multi-bit values, which represents a continuous time-averaging of the current signal output by the pre-amplifier 206. This is performed via the CT-ΣΔ ADC 254 encoding the chopped version of the difference between the voltage lines (i.e. the differential voltage signal that is proportional to the differential current signal). The encoded digital data (i.e. the digital data stream) is then passed through a digital chopper 256, which is also referred to herein as a demodulator, to generate a demodulated digital data stream.

The DC component rejection path 250A further includes digital integration circuitry 258, which enables the digital integration of the data represented via the demodulated digital data stream, to output a digital representation of the DC component cancellation signal based upon the continuous time-averaging of the current signal. It is noted that the DC component cancellation signal represents not only the DC offsets introduced into the AC magnetic field component sensor path 204 via the pre-amplified 260, but also DC offsets introduced via the via the CT-ΣΔ ADC 254. Thus, both DC offsets are compensated in this manner.

The digital representation of the DC component cancellation signal represents a multi-bit scaling of the continuous time-averaging of the current signal output by the pre-amplifier 206 with respect to a maximum and minimum range of the received differential voltage signal. For example, the multi-bit digital data output via the digital integration circuitry 258 may represent a set of bits to encode positive and negative values within a range of ±10 mV, or any suitable voltage range based upon the particular application.

To generate the DC component cancellation signal, the digital integration circuitry 258 may be implemented as any suitable hardware, software, or combinations of these. For instance, the digital integration circuitry 258 may be implemented via execution of a suitable algorithm that is executed by one or more processors, a controller, etc. To provide another example, the digital integration circuitry 258 may be implemented as an up/down counter, as discussed in further detail herein with reference to FIG. 2B. In still other embodiments, the digital integration circuitry 258 may alternatively be implemented as finite impulse response (FIR) or higher-order digital filters. Regardless of the particular implementation, the digital integration circuitry 258 is configured to generate the digital representation of the DC component cancellation signal by continuously accumulating the polarity-reversed multi-bit representation of the continuous time-averaging of the current signal output by the pre-amplifier 206, which is output via the digital chopper 256 and proportional to the differential voltage signal received by the CT-ΣΔ ADC 254 as noted above.

The DC component rejection path 250A further includes a digital to analog converter (DAC) 260 that is configured to convert the digital representation of the DC component cancellation signal to a differential current signal to generate the DC component cancellation signal. To do so, the DAC 260 may be implemented as any suitable type of DAC configured to provide a differential current signal having a polarity that compensates for the polarity of the digital representation of the DC component cancellation signal received via the digital integration circuitry 258. For example, the DAC 260 may be configured to generate the DC component cancellation signal having a polarity that reverses that of the digital representation of the DC component cancellation signal. This may be implemented, for instance, by selecting the appropriate current sources for each rail of the DAC 260.

Figure 2B:
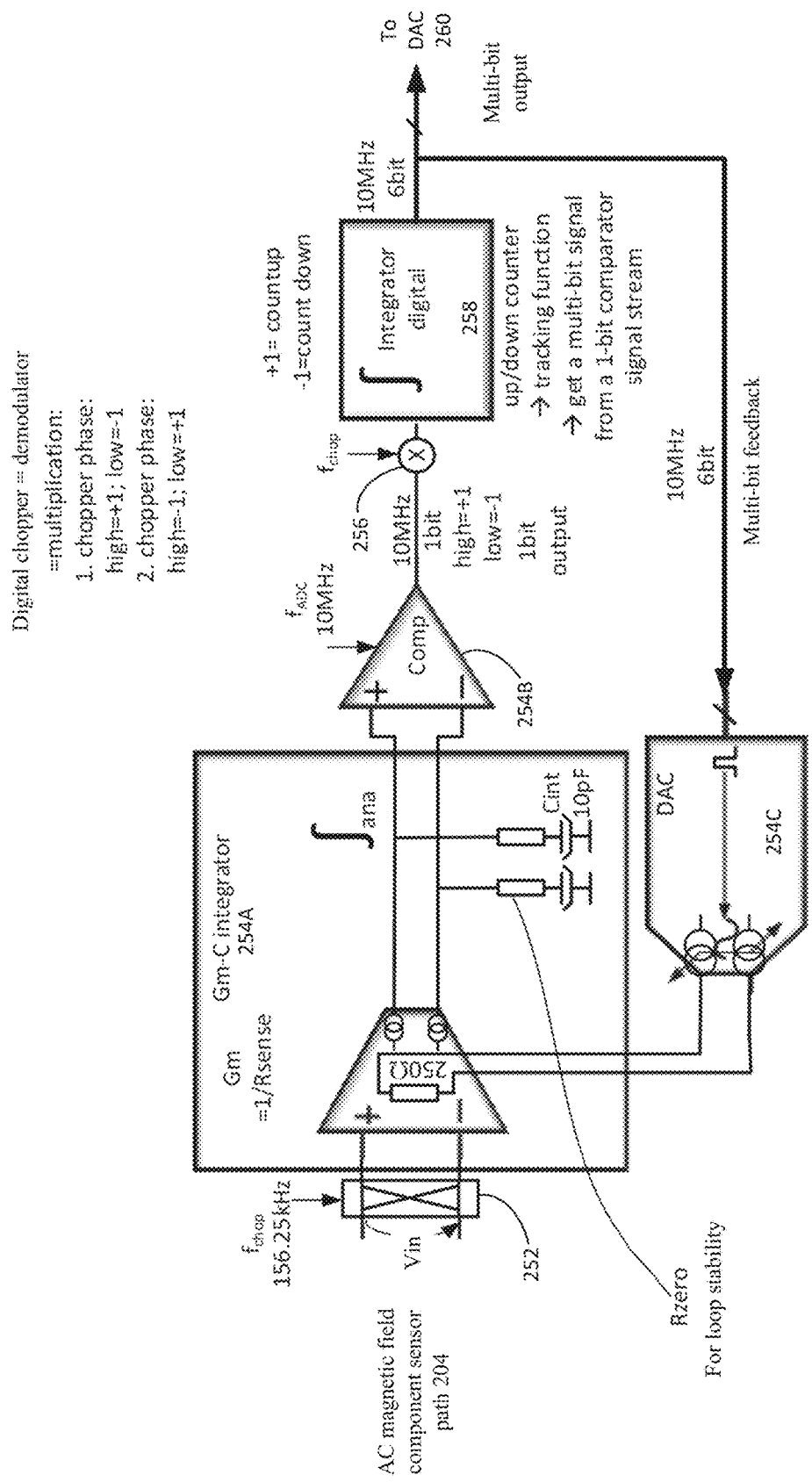
FIG. 2B illustrates additional details of the DC component rejection path identified with the hybrid magnetic field sensor configuration as shown in FIG. 2A, in accordance with an embodiment of the disclosure.

Additional details regarding the configuration and operation of the DC component rejection path 250A as shown in FIG. 2A are now described with reference to FIG. 2B. The components as shown in FIG. 2B are identified with some of the components of the DC component rejection path 250A as shown in FIG. 2A having common reference numerals. Moreover, the CT-ΣΔ ADC 254 is shown in additional detail in FIG. 2B comprising three separate components: a transconductance integrator 254A, a comparator 254B, and a feedback DAC 254C. It is noted that in the present embodiment the feedback DAC 254C forms part of the CT-ΣΔ ADC 254 as shown in FIG. 2A, and is a separate component from the DAC 260. However, in other embodiments that are further discussed below, the feedback DAC 254C may be implemented in place of the DAC 260, rendering the DAC 260 unnecessary.

Thus, the differential voltage Vin as shown in FIG. 2B is identified with the differential current signal that is output via the pre-amplifier 206 in the AC magnetic field component sensor path 204, which has been converted to the differential voltage signal Vin by way of the resistors R as shown in FIG. 2A. The chopper switch 252 is driven at a chopper frequency $f_{chop}$, which is 156.25 kHz in this example, although the embodiments as described herein may use any suitable chopper frequency based upon the particular application. Again, the chopper switch 252 function to exchange the input connections identified with the differential voltage signal Vin at the chopper frequency, thereby functioning as a modulator to perform an equivalent multiplication function of multiplying the differential voltage signal by +1 and −1 in accordance with the chopper frequency.

The chopped (i.e. modulated) differential voltage signal is then fed into a transconductance integrator 254A, which converts the differential modulated voltage signal back to a differential current signal that is fed to a comparator 254B and integrated via the capacitors Cint. The integrated current signal is then provided to the comparator 254B, which is driven by an ADC clock $f_{ADC}$ of 10 MHz in this example, although the embodiments as described herein may use any suitable ADC frequency based upon the particular application. The comparator 254B is configured to sequentially compare the integrated current signal output by the transconductance integrator 254A to predetermined values to output a digital data stream of one-bit values at the $f_{ADC}$ clock frequency.

Each bit in the digital data stream thus represents the result of the comparison between the differential current signal components output via the transconductance amplifier 254A. The digital data stream is further coupled to the digital chopper switch 256, which functions to perform a multiplication operation to demodulate the digital data stream to provide a demodulated data stream. For example, if the input signal Vin includes a DC offset component, then this DC offset component is modulated after the chopper switch 252 to an AC signal, which is provided to the transconductance integrator 254A. The integration function of the transconductance integrator 254A provides an integrated AC signal value that is fed to the comparator 254B, which then outputs a value based upon the comparison via the comparator 254B that is demodulated via the digital chopper 256 back to a DC value. This DC value is then input to the digital integration circuitry 258 as discussed herein to generate the DC offset cancellation signal, which is also fed back to the transconductance integrator 254A as an analog voltage or current after conversion via the DAC 254C (which is a current DAC in this example, but may be implemented as a voltage DAC to provide the feedback signal as a voltage signal) to enable filtering of the DC offset signal. It is noted that the DAC 254C may be of any suitable resolution, and is configured as a 6-bit DAC as shown in FIG. 2B for purposes of brevity. However, the DAC 254C need not have a particularly high resolution as the DAC 254C is used for the stabilization of the CT-ΣΔ ADC 254. In contrast, the external DAC 260 (i.e. external to the of the CT-ΣΔ ADC loop) may have a significantly higher resolution (e.g. 10-bits, 12-bits, 13-bits, etc.), as the DAC 260 is configured to generate the DC offset cancellation signal with a higher accuracy and granularity compared to the signal generated via the DAC 254C.

Thus, the resulting demodulated digital data stream output by the digital chopper 256 is fed into the digital integration circuitry 258, which generates the multi-bit digital data in accordance with the resolution of the DAC 254C (6 bits in this example). Thus, the digital integration circuitry 258 functions to count up or to count down in response to received data bits within the demodulated data stream output by the digital chopper 256. For instance, the digital integration circuitry would continue to count up as digital data bits are received of a predetermined logic value, and to count down in response to receiving digital data bits of a complementary logical value.

The multi-bit digital data represents the digital representation of the of the DC component cancellation signal as noted above, which is converted to a differential current signal via the feedback DAC 254C that is provided as feedback to the transconductance integrator 254A. The differential current signal provided by the feedback DAC in this manner functions to cancel the DC offsets introduced by the transconductance integrator 254A. As shown in FIG. 2A, the multi-bit digital data is also provided, in this example, to the DAC 260 as noted above, which performs digital-to-analog conversion to generate the polarity-reversed DC component cancellation signal that is coupled to the AC magnetic field component sensor path 204 to remove or at least reduce the DC offset that may otherwise be introduced into the current signal output via the pre-amplifier 206.

Figure 2C:
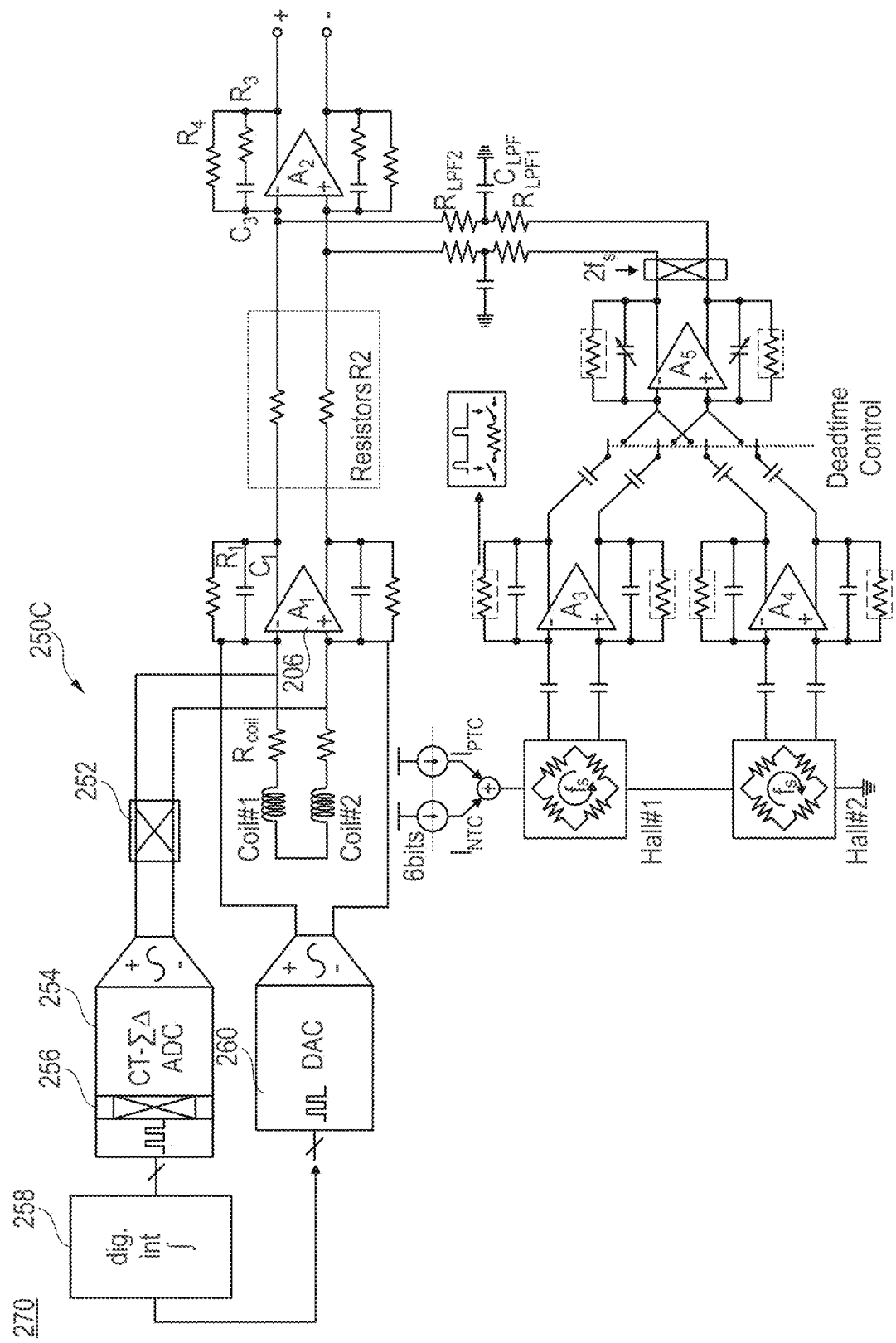
FIGS. 2C-2E illustrate further example hybrid magnetic field sensor configurations implementing a digital-based DC component rejection path, in accordance with various embodiments of the disclosure.

FIG. 2C illustrates an example hybrid magnetic field sensor configuration, in accordance with an embodiment of the disclosure. The hybrid magnetic field sensor 270 as shown in FIG. 2C has a similar or identical configuration as the hybrid magnetic field sensor configuration 200 as shown in FIG. 2A, with the exception of the coupling points between the DC component rejection path 250C and the AC magnetic field component sensor path 204. The DC component rejection path 250C as shown in FIG. 2C may include the same components as the DC component rejection path 250A as shown in FIG. 2A. Moreover, the AC magnetic field component sensor path 204 is not labeled in FIG. 2C for purposes of brevity, but may include the same components as the AC magnetic field component sensor path 204 as shown in FIG. 2A with the exception of the resistors R2 being implemented in place of the resistors R.

As shown in FIG. 2C, both the inputs and the outputs of the "loop" identified with the DC component rejection path 250C are coupled to the AC magnetic field component sensor path 204 at the input to the pre-amplifier 206, versus the output of the pre-amplifier 206 as shown in FIG. 2A. Thus, the input (i.e. the portion of the DC component rejection path 250C coupled to the chopper switch 252 in this example) and the output of the DC component rejection path 250C (i.e. the output of the DAC 260 in this example) are coupled to the same stage within the AC magnetic field component sensor path 204. Therefore, in this configuration, the DC component rejection path 250C is configured to perform a continuous time averaging of the coil sensor signal provided to the input of the pre-amplifier 206, and the DAC 260 is configured to provide the DC offset cancellation signal to the input of the pre-amplifier as a differential current signal to induce a voltage having an opposite polarity as the DC offset present in the coil sensor signal. As a result, the pre-amplifier 206 does not pass this DC offset to the output stage.

The coupling of the inputs and outputs of the DC component rejection path to the input stage or the output stage with respect to the pre-amplifier 206 has different advantages and disadvantages in each case, and thus the decision for a particular implementation may be driven by the needs of each particular application. For example, the sensing of DC offset at the input of the pre-amplifier 206 as shown in FIG. 2C may advantageously provide benefits such as rejection of the high-frequency coil sensor signal via the virtual short-circuit formed by the input terminals of the pre-amplifier 206, leading to less demodulation effects. However, because the DC offset signal is not amplified, the DC component rejection path 250C needs to be designed to detect very small DC offset values in this configuration with a high accuracy. Furthermore, the sensing of DC offset at the output of the pre-amplifier 206 as shown in FIG. 2A may advantageously provide benefits in that the DC offset signal is amplified via the pre-amplifier 206, relaxing the accuracy requirements for the DC component rejection path 250. However, the configuration as shown in FIG. 2A results in the high-frequency coil sensor signal being present at the differential output of the pre-amplifier 206, which then is preferably filtered. This may further lead to potential demodulation effects such as a high-frequency coil sensor signal with a high amplitude being partially demodulated and recognized as a DC signal for the DC component rejection path 250C.

Figure 2D:
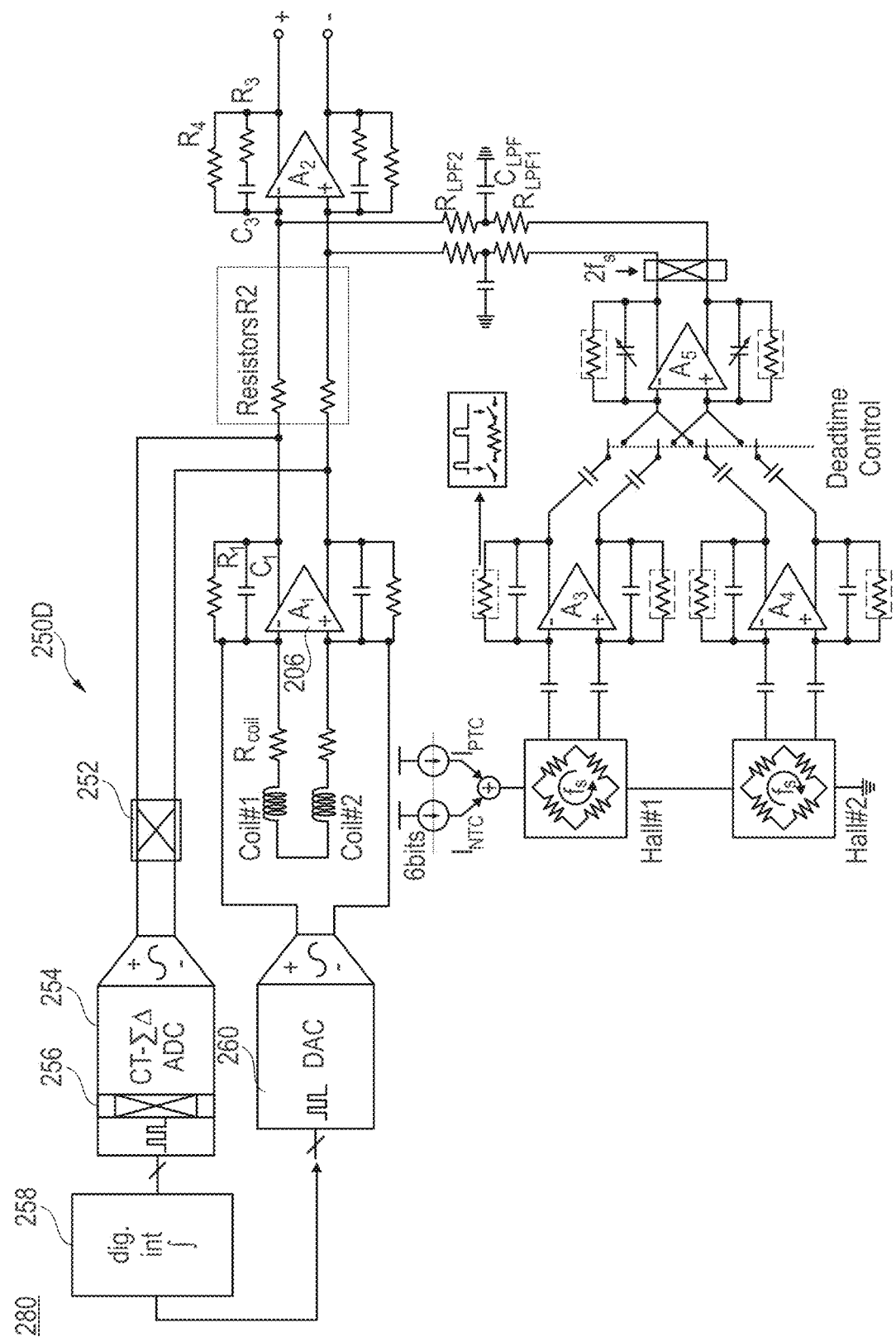

FIG. 2D illustrates a further example hybrid magnetic field sensor configuration, in accordance with an embodiment of the disclosure. The hybrid magnetic field sensor 280 as shown in FIG. 2D has a similar or identical configuration as the hybrid magnetic field sensor configuration 200 as shown in FIG. 2A, with the exception of the coupling points between the DC component rejection path and the AC magnetic field component sensor path. The DC component rejection path 250D as shown in FIG. 2D may include the same components as the DC component rejection paths 250A, 250C as shown in FIGS. 2A and 2C, respectively. Moreover, the AC magnetic field component sensor path is not labeled in FIG. 2D for purposes of brevity, but may include the same components as the AC magnetic field component sensor path 204 as shown in FIG. 2C.

As shown in FIG. 2D, both the inputs and the outputs of the "loop" identified with the DC component rejection path 250D are coupled to the AC magnetic field component sensor path at different respective stages. For instance, the input of the DC component rejection path 250D is coupled to the output of the pre-amplifier 206, whereas the output of the DC component rejection path 250D is coupled to the input to the pre-amplifier 206. Thus, the DC offset cancellation signal is generated based upon a continuous-time averaging of the amplified high-frequency coil sensor signal, which is converted this example from a differential voltage signal to a differential current signal. The differential current signal is once again converted to a differential voltage signal that is fed to the chopper switch 252 (in this example) by way of the resistive divider formed between the feedback path of the pre-amplifier 206 and the resistors R2. The DAC 260 then provides the DC cancellation signal to the input of the pre-amplifier 206 as a differential current signal, in a similar manner as discussed above with reference to FIG. 2C. In other words, in contrast to the configuration as shown in FIG. 2A, the DC offset is measured directly at the output of the pre-amplifier 206 versus a measurement of a divided voltage at a voltage divider formed from the Resistors R in FIG. 2A. Such embodiments may be particularly useful to relax the residual offset requirements of the input to the CT-ΣΔ ADC 254.

Figure 2E:
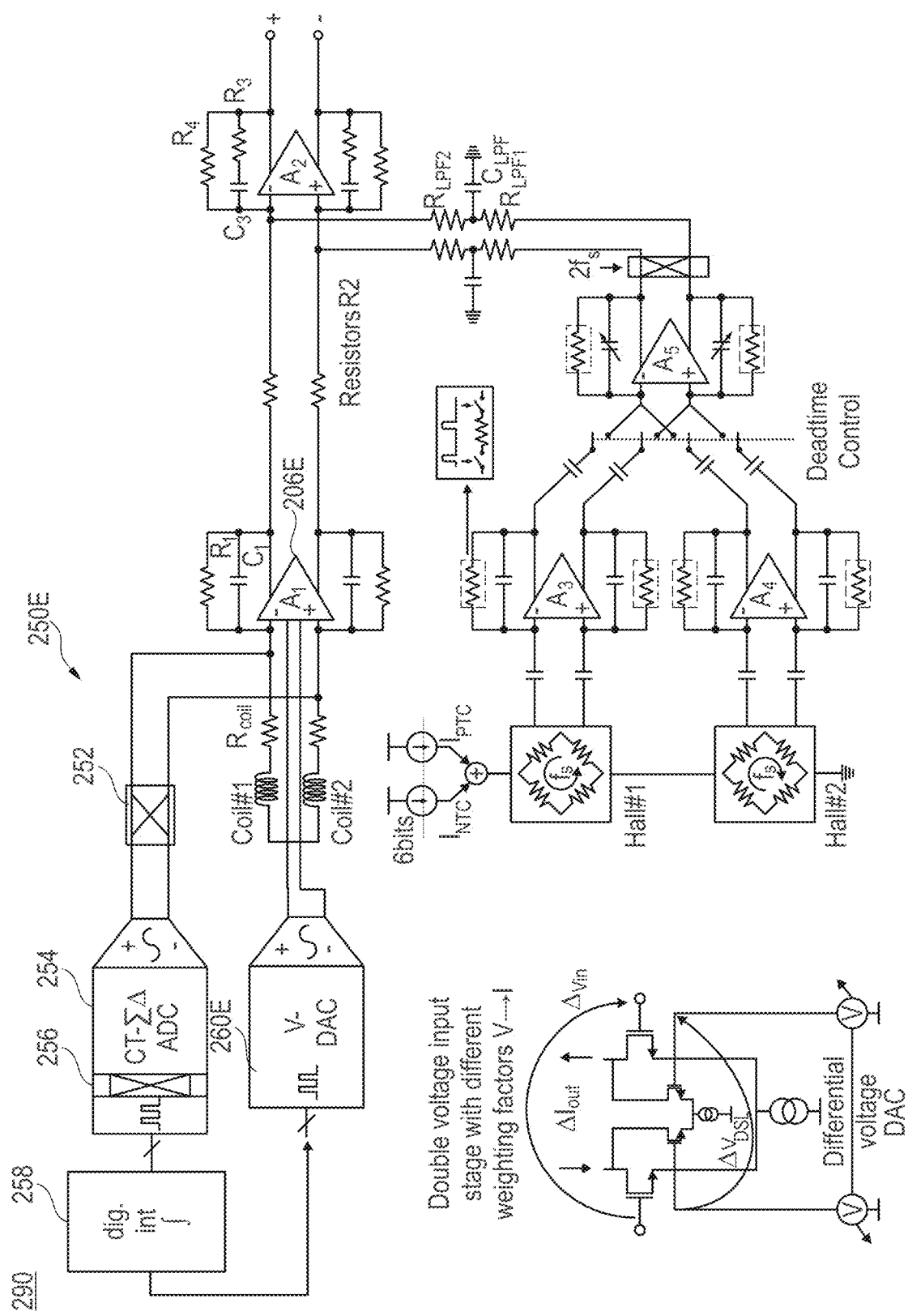

FIG. 2E illustrates a further example hybrid magnetic field sensor configuration, in accordance with an embodiment of the disclosure. The hybrid magnetic field sensor 290 as shown in FIG. 2E has a similar or identical configuration as the hybrid magnetic field sensor configuration 200 as shown in FIG. 2C, and therefore only differences between these two hybrid magnetic field sensor configurations are provided. First, the hybrid magnetic field sensor 290 as shown in FIG. 2E implements a differential voltage DAC 260E in place of the differential current DAC 260 as shown in FIG. 2C. Furthermore, the pre-amplifier 260E as shown in FIG. 2E is implemented as a double voltage input stage amplifier as shown by the inset.

Thus, the pre-amplifier 206E is configured to receive the high-frequency coil sensor signal as a differential voltage via the ΔVin terminals, and to output a differential current signal via the ΔIout terminals, as shown in FIG. 2E. The DC offset cancellation signal is generated in a similar manner as discussed above with reference to FIG. 2C. However, the digital representation of the DC offset cancellation signal is converted to a scaled analog differential voltage signal having opposite polarity as the DC offset present in the coil sensor signal, as opposed to a differential current signal. The DC offset cancellation signal is thus applied as a differential voltage signal to the differential voltage DAC inputs of the pre-amplifier 260E as shown in the inset.

Figure 3A:
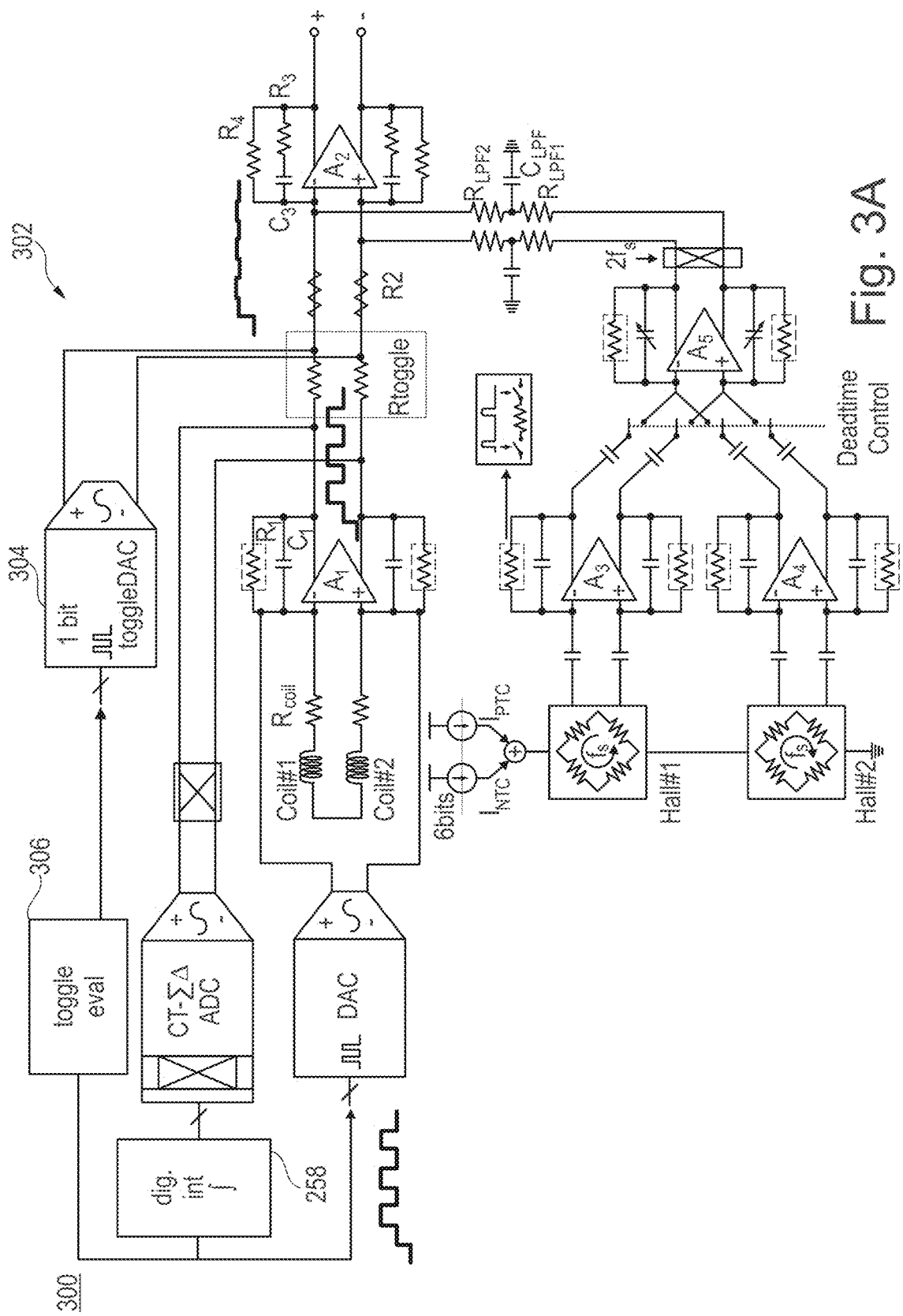
FIG. 3A illustrates an example hybrid magnetic field sensor configuration implementing a quantization noise reduction path, in accordance with an embodiment of the disclosure.

FIG. 3A illustrates an example hybrid magnetic field sensor configuration implementing a quantization noise reduction path, in accordance with an embodiment of the disclosure. The quantization noise reduction path 302 is shown in FIG. 3 as being implemented in a similar manner as the hybrid magnetic field sensor configuration 280 illustrated in FIG. 2D, although this is by way of example and not limitation. The quantization noise reduction path 302 may be implemented in accordance with any of hybrid magnetic field sensor configurations as discussed herein, such as those shown in FIGS. 2A-2D for instance. Moreover, the hybrid magnetic field sensor configuration as shown in FIG. 3A may include similar or identical components as the hybrid magnetic field sensor configurations as shown and discussed herein with respect to FIGS. 2A-2D, and thus the reference numerals and accompanying description of these components have been omitted for purposes of brevity.

The quantization noise reduction path 302 as shown in FIG. 3A includes a 1-bit digital-to-analog converter (DAC) 304 and a toggle evaluation block 306. The quantization noise reduction path 302 is coupled to the DC component rejection path and to the AC magnetic field component sensor path. The input of the quantization noise reduction path 302 is coupled to the output of the digital integrator 258. The output of the quantization noise reduction path 302 is coupled to the output stage of the pre-amplifier 206 via between the resistors Rtoggle and R2, which are used in place of the resistors R2 as shown in FIG. 2D. Moreover, the differential current signal output by the pre-amplifier 206 is converted to a differential voltage signal via the resistive divider formed by the feedback resistors R1 of the pre-amplifier 206 and the resistors Rtoggle. Thus, the additional resistors Rtoggle and R2 as shown in FIG. 3A enable the DC component rejection path to receive the differential voltage signal via the chopper switch in a similar manner as discussed with reference to FIG. 2D.

The quantization noise reduction path 302 is configured to generate a quantization noise cancellation signal based upon the clock signal used by the CT-ΣΔ ADC 254. The quantization noise cancellation signa is coupled to the differential signal path nodes of the AC magnetic field component sensor path to cancel (or at least reduce) quantization noise introduced into the digital representation of the DC component cancellation signal. For example, and with reference to FIG. 2B, the CT-ΣΔ ADC 254 implements an ADC clock having a frequency $f_{ADC}$ of 10 MHz in this example. Thus, the output of the digital integration circuitry 258, which is the digital representation of the DC offset cancellation signal as described above, may contain oscillations of the ADC clock at the frequency $f_{ADC}$ as a result of the CT-ΣΔ ADC 254 encoding the received input signal, a phenomenon that is known as quantization noise. The quantization noise may be present during periods in which the input signal is changing between different values, as the CT-ΣΔ ADC 254 functions to track these changes in a step-wise manner, and may also be present during periods of steady state.

Figure 3B:
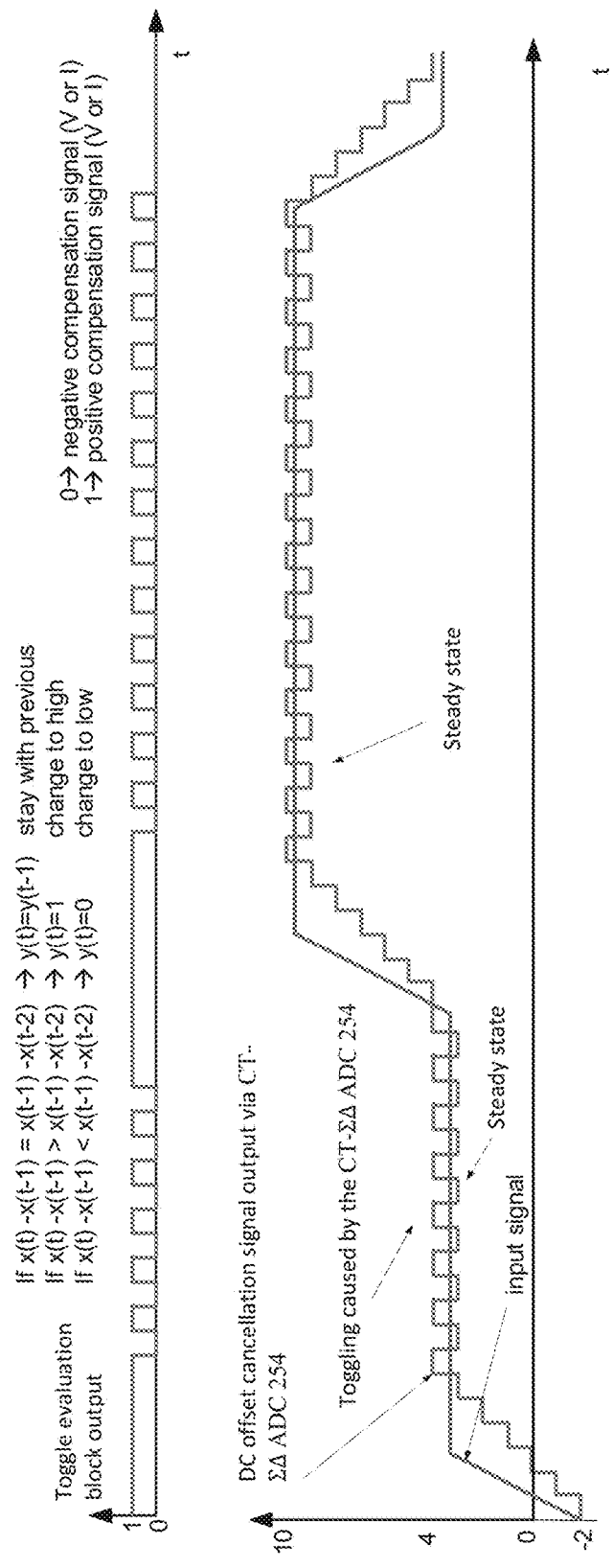
FIG. 3B illustrates an example timing diagram illustrating details of operation of components of the quantization noise reduction path, in accordance with an embodiment of the disclosure.

Turning now to FIG. 3B, the quantization noise is shown with respect to the toggling of the multi-bit digital data (i.e. the digital representation of the DC offset cancellation signal) output by the CT-ΣΔ ADC 254, which tracks the input signal (e.g. the differential voltage signal that is proportional to the differential current signal output by the pre-amplifier 206). The y-axis of the bottom graph as shown in FIG. 3B illustrates changes in the digital value represented by the multi-bit digital data as a result of the quantization noise. During periods in which the coil sensors measure a changing magnetic field exceeding a threshold, the input signal changes as shown in FIG. 3B, and during these transitions the quantization noise cannot easily be identified or removed. However, the quantization noise reduction path 302 may remove or at least reduce the quantization noise during steady state time periods. A steady state time period may be identified, for instance, as time periods during which the measured magnetic field components within the frequency range used by the AC magnetic field component sensor path 204 deviate less than a threshold value over a threshold time period. As a result, the input signal x(t) (e.g. the differential voltage signal that is proportional to the differential current signal output via the pre-amplifier 206), likewise deviates less than a threshold amplitude over a threshold time period.

To do so, the toggle evaluation block 306 may be implemented as any suitable combination of hardware and/or software components. For instance, the toggle evaluation block 306 may be implemented as any suitable type of circuitry such as a counter or a controller that executes a suitable algorithm to perform such functions. To provide an illustrative example, the functionality of the toggle evaluation block 306 is shown in the upper graph of FIG. 3B, which functions to compare one or more previous states of the DC offset cancellation signal (represented as x(t)) to determine an output signal represented as y(t). The output signal y(t) is thus output by the toggle evaluation block 306 and coupled to the 1-bit toggle DAC 304.

In other words, and as shown in FIG. 3A, the toggle evaluation block 306 functions to output a predetermined logical value (e.g. 1 or 0) when the input signal is identified as changing between different states (i.e. the magnetic field is changing at a rate in excess of a threshold frequency). However, when a steady state condition is detected based upon a change in the input signal value from a predetermined number of previous clock cycles, then the output signal emulates the toggling of the input signal as a result of the ADC clock.

The 1-bit toggle DAC 304 receives the signal y(t) output via the toggle evaluation block 306 and outputs the quantization noise cancellation signal, which may be a stream of digital data bits that have the same amplitude as the quantization noise but are 180 degrees out of phase. For instance, the 1-bit toggle DAC 304 is configured to provide a positive or negative differential voltage or current signal that corresponds, respectively, to a specific logical bit value, with the 1-bit toggle DAC 304 generating two different differential analog values corresponding to two different respective logical values (e.g. 0 and 1). For example, and as shown in FIG. 3A, the 1-bit toggle DAC 304 may generate the quantization noise cancellation signal as a differential current signal having an analog value that corresponds to the different logical values of the signal output by the toggle evaluation block 306, which are converted to voltage values via the Rtoggle resistors. These predetermined analog values may be selected to substantially match (e.g. excepting for tolerances) the amplitude of the quantization noise, and may have a frequency that matches the ADC clock but is phase-shifted by 180 degrees. In other words, the quantization noise cancellation signal toggles in the same manner as the signal y(t) output via the toggle evaluation block 306 when the input signal is at a steady state, and otherwise retains a predetermined constant value. The quantization noise reduction path 302 thus provides the quantization noise cancellation signal at an input of the output amplifier 208 to at least partially cancel the quantization noise while the input signal (i.e. the sampled signal, which is the output of the pre-amplifier 206 in this example) is at a steady state.

Figure 4A:
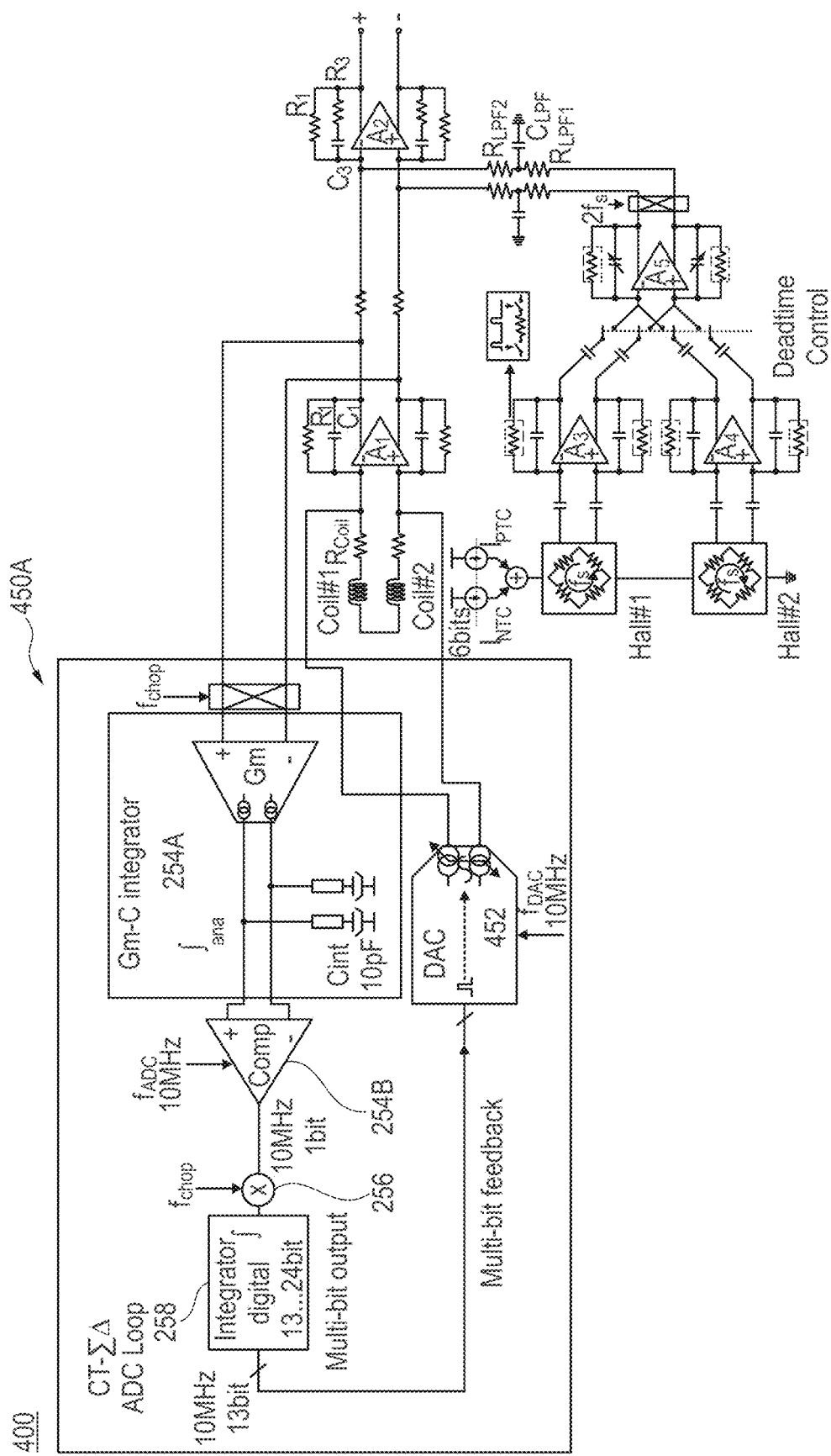
FIGS. 4A-4C illustrate an example hybrid magnetic field sensor implementing a digital-based DC component rejection path that eliminates the need for an external DAC.
Figure 4B:
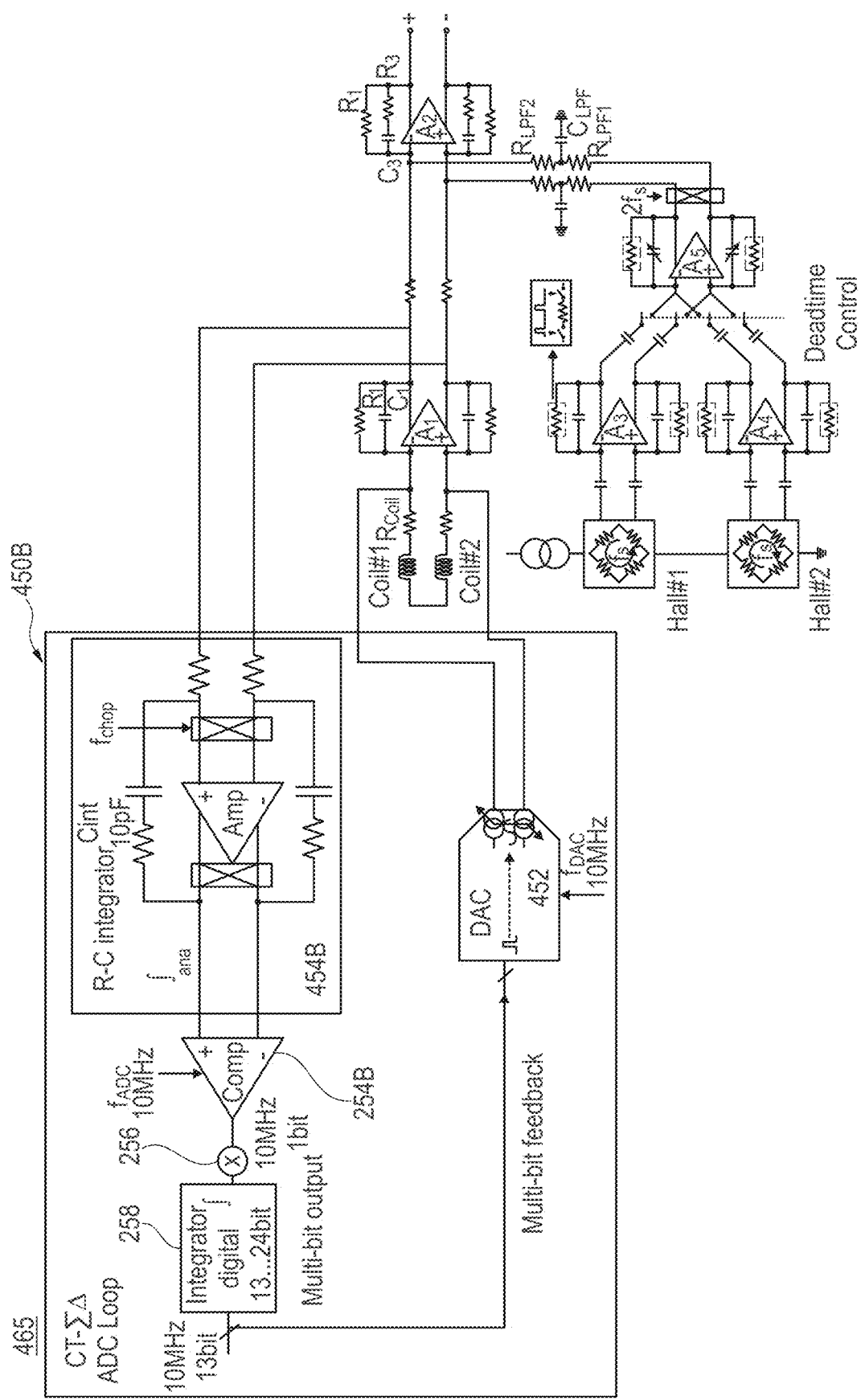
Figure 4C:
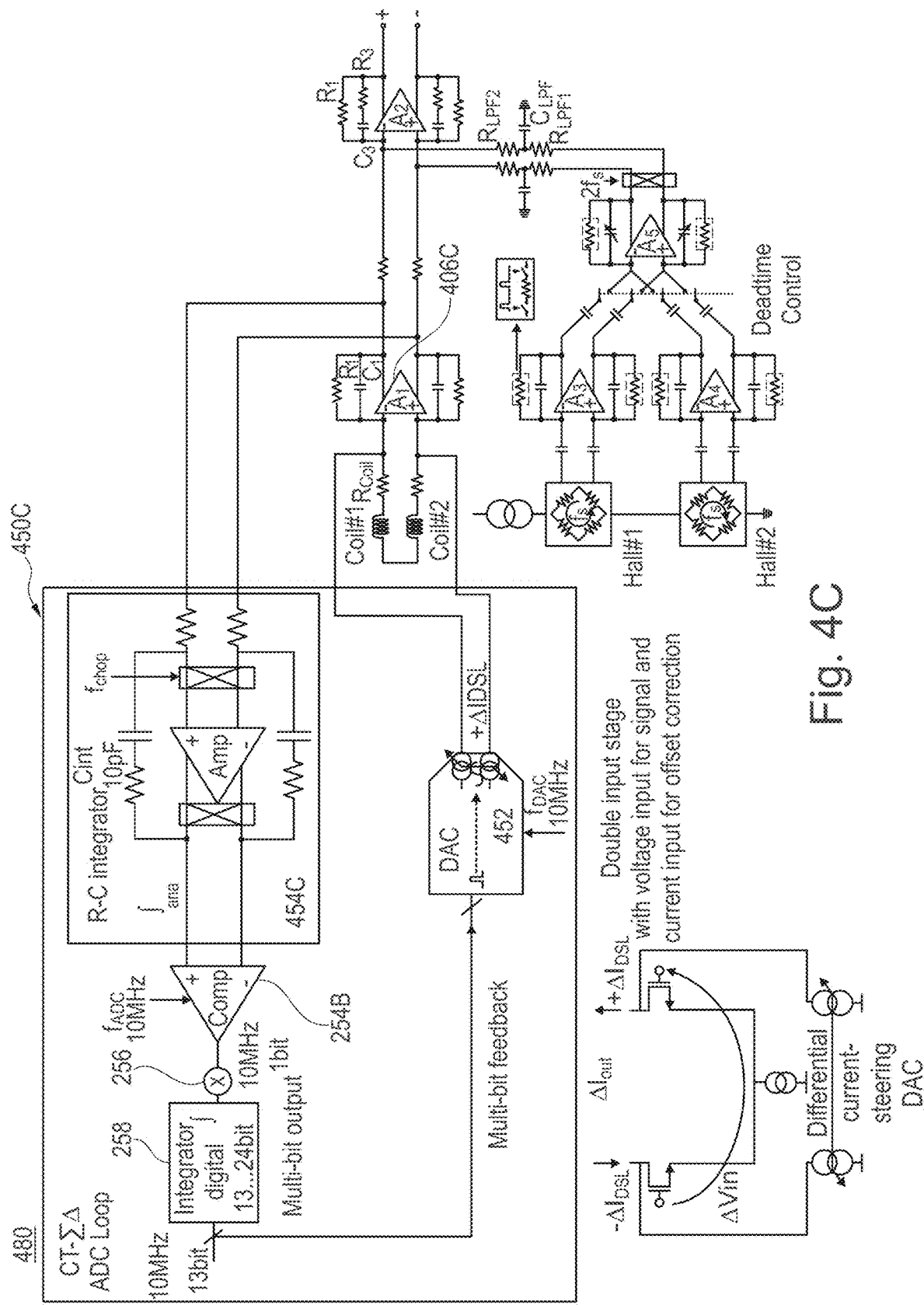

FIGS. 4A-4C illustrate example hybrid magnetic field sensors implementing a DC component rejection path that eliminates the need for an external DAC. The hybrid magnetic field sensors 400, 465, 480 as shown in FIGS. 4A-4C, respectively, implement similar or identical components to those shown in FIGS. 2A-2E, and such identical components are not labeled in FIGS. 4A-4C with reference numerals for purposes of brevity. Moreover, the hybrid magnetic field sensors 400, 465 as shown in FIGS. 4A and 4B are configured in a similar manner as the hybrid magnetic field sensor 280 as shown in FIG. 2D, with the input of each respective the DC component rejection path 450A, 450B being coupled to the output of the pre-amplifier 206, and the outputs of each respective the DC component rejection path 450A, 450B being coupled to the input of the pre-amplifier 206. The hybrid magnetic field sensor 480 as shown in FIG. 4C, however, has an input coupled to the output of the pre-amplifier 406C. The pre-amplifier 406C is also configured as a dual-stage amplifier that outputs a differential current signal and receives the DC offset cancellation signal in the form of a differential current signal, and receives the high-frequency coil sensor signal as a differential voltage, as shown by the inset in FIG. 4C.

The hybrid magnetic field sensor 400 as shown in FIG. 4A implements the DC component rejection path 450A using similar or identical components as shown in FIG. 2B. In particular, the DC component rejection path 450A comprises the transconductance integrator 254A, the comparator 254B, the digital chopper 256, and the digital integrator 258, which provides a multi-bit digital representation of the DC offset cancellation signal. However, the lower-resolution feedback DAC 254C as shown in FIG. 2A is replaced in FIG. 4A with a higher resolution DAC 452, and the feedback loop is now "opened" to connect the output of the DAC 452 to the AC magnetic field component sensor path. Thus, the CT-ΣΔ ADC 254 as shown in FIG. 2B may be modified in this configuration to eliminate the DACs 260, 260E that are external to the CT-ΣΔ ADC loop that forms the DC component rejection path 450A. The DAC 452 may have any suitable resolution based upon the particular application, such as 10-bits, 12-bits, 13-bits (as shown in FIG. 2A), etc., and may have a resolution and/or configuration identical to the external DACs 260, 260E as discussed above.

The hybrid magnetic field sensors 465, 480 implement respective DC component rejection paths 450B, 450C, which may have identical components as one another, with several also being identical to those implemented in the DC component rejection paths 450A as shown in FIG. 4A. For instance, each of the respective DC component rejection paths 450B, 450C implements a comparator 254B, as well as the digital chopper 256, digital integrator 258, and the DAC 452. However, in contrast to the hybrid magnetic field sensor 400, which implements a transconductance integrator 454A, each of the hybrid magnetic field sensors 465, 480 as shown in FIGS. 4B and 4C, respectively, implement R-C integrators 454B, 454C.

The transconductance integrator 454A has the benefit of a high-resistive input and a simplified circuit technique as opposed to a 2-stage operational amplifier that is usually needed for an RC-integrator. The integrating resistors in the RC-integrators 454B, 454C (which include the resistors directly coupled to the output of the pre-amplifier 206) limit the input impedance to the DC component rejection 450C. However, this effect can be ignored in the implementations as shown in FIGS. 4B and 4C because the integrating resistors are connected with the low-ohmic output of the pre-amplifier 206, and can be driven by the output of the pre-amplifier 206 in this configuration. Moreover, RC-integrators generally have a higher accuracy compared to transconductance integrators, especially if 2-stage amplifiers are implemented. Thus, the decision regarding the implementation of a transconductance integrator versus an R-C integrator may be driven by design considerations such as desired accuracy, ease of manufacturing, availability of components, and cost.

Figure 4D:
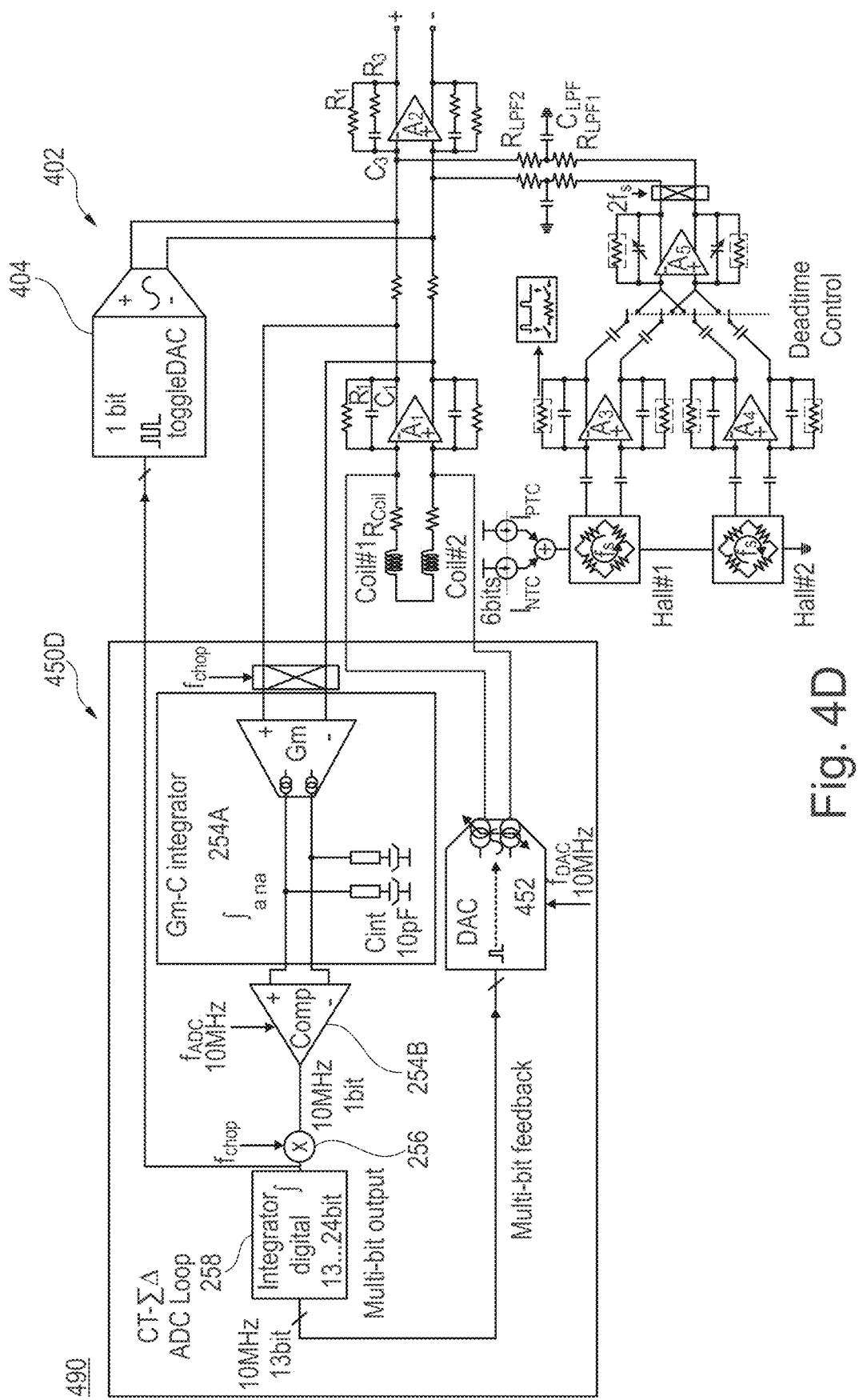
FIG. 4D illustrates an example hybrid magnetic field sensor implementing a quantization noise reduction path and a digital-based DC component rejection path that eliminates the need for an external DAC.

FIG. 4D illustrates an example hybrid magnetic field sensor implementing a quantization noise reduction path and a digital-based DC component rejection path that eliminates the need for an external DAC. The hybrid magnetic field sensor 490 as shown in FIG. 4D has a similar configuration as the hybrid magnetic field sensor configuration 400 as shown in FIG. 4A. However, like the hybrid magnetic field sensor 300 as shown in FIG. 3A, the hybrid magnetic field sensor 490 further includes a quantization noise reduction path 402, which includes a 1-bit digital-to-analog converter (DAC) 404. In this implementation, however, the quantization noise reduction path 402 does not include a toggle evaluation block 306. The 1-bit DAC 404 may be implemented in accordance with any suitable type of circuit architecture based upon the type of signal that is sampled and/or the particular stage of the DC component rejection path from which the signal is sampled. As an example, the 1-bit DAC 404 as shown in FIG. 4D may be implemented as a current-steering DAC. Thus, the quantization noise reduction path 402 is directly coupled to the demodulated comparator output from the chopper 256. Thus, the quantization noise reduction path 402 represents a direct and simplified way for quantization noise rejection without the need of a toggle evaluation circuit. That is, the quantization noise cancellation signal may be alternatively generated in this manner by feeding the chopped output from the 1-bit comparator 254B to the 1 bit-DAC 404. This technique may be implemented in accordance with any of the hybrid magnetic field sensors as discussed herein, which may implement additional, fewer, or alternate components as part of the DC component rejection path.

Advantageously, it is noted that because of the use of the DC component rejection path in each of the embodiments discussed in this Section, the coupling between the high-frequency magnetic field sensor (e.g. the coil sensor elements) and the pre-amplifier (e.g. 206, 206E, 406C, etc.) in the AC magnetic field component sensor path may be simplified. In particular, a direct connection between the high-frequency magnetic field sensor elements and the pre-amplifier in the AC magnetic field component sensor path may be implemented via the coil resistors. This is due to the use of the DC component cancellation signal to perform cancellation or reduction of the DC offset that would otherwise be contained in the signal coupled to the pre-amplifier via the high-frequency magnetic field sensor elements. This coupling would otherwise require the use of additional chopper switches or other DC offset cancellation techniques, which are obviated by way of the embodiments described in this Section.

Figure 5B:
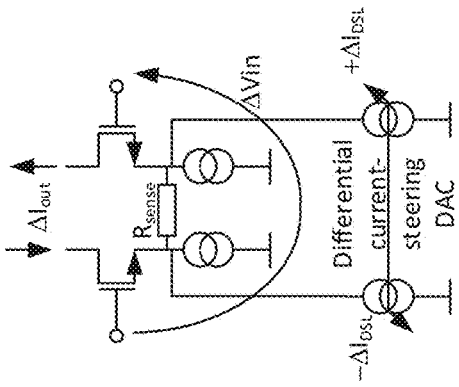
FIGS. 5A-5B illustrate input stages of integrators for a DC component rejection path.
Figure 5A:
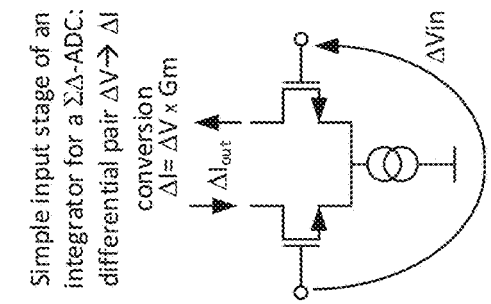

FIGS. 5A-5B illustrate input stages of integrators for a DC component rejection path. The architectures as shown in 5A and 5B may be implemented in accordance with any of the hybrid magnetic field sensors as discussed herein. For example, the architecture 500 as shown in FIG. 5A may be implemented as an input to the R-C integrators 454B, 454C as shown in FIGS. 4B and 4C, as well as an input to the transconductance integrators 254A as shown in FIGS. 2B, 4A, and 4D. As another example, the architecture 550 as shown in FIG. 5B may be implemented as an input to the CT-ΣΔ ADC 254 as shown in FIGS. 2C, 2D, 2E, and 3A. In each case, the ΔVin terminals may be identified with the differential voltage input signal provided by the chopper switch that is coupled to the input of each respective R-C integrator, transconductance integrator, CT-ΣΔ ADC, etc., as the case may be.

Various examples of hybrid magnetic field sensors are described above with respect to FIGS. 2A-2E, 3A-3B, and 4A-4C. The configurations are by way of example and not limitation, and any features of these various architectures may be combined with one another. For example, the hybrid magnetic field sensors 400, 465, 480 as shown in FIGS. 4A-4C may implement the quantization noise reduction path 302 as shown in FIG. 3A. To provide another example, any of the hybrid magnetic field sensors as described above with respect to FIGS. 2A-2E, 3A-3B, and 4A-4C may implement an AC magnetic field component sensor path utilizing any of the various pre-amplifier and DAC configurations (e.g. current or voltage based DACs), in accordance with suitable configurations thereof. As yet another example, any of the hybrid magnetic field sensors as described above with respect to FIGS. 2A-2E, 3A-3B, and 4A-4C may implement a DC component rejection path utilizing a transconductance integrator or an R-C integrator as discussed herein. Combinations of any of these aforementioned parameters may be combined to yield further embodiments.

II. Hybrid Magnetic Field Sensor Configurations Implementing an Analog-Based DC Component Rejection Path FIGS. 6A-6F illustrate example hybrid magnetic field sensor configurations implementing an analog-based DC component rejection path, in accordance with various embodiments of the disclosure. For purposes of brevity, each of the hybrid magnetic field sensor configurations as shown in FIGS. 6A-6E only illustrate an AC magnetic field component sensor path and an accompanying DC component rejection path. For example, and with reference to FIG. 6A, the AC magnetic field component sensor path 604 includes coil sensor elements coupled to a pre-amplifier 606A. With the exception of the differences as further discussed in this Section, the AC magnetic field component sensor path 604 may function in an identical manner as the AC magnetic field component sensor path 204 discussed above. For instance, the pre-amplifier 606 receives a high-frequency sensor signal via the coil sensor elements as a differential voltage, for instance, and outputs a differential current signal.

Figure 6A:
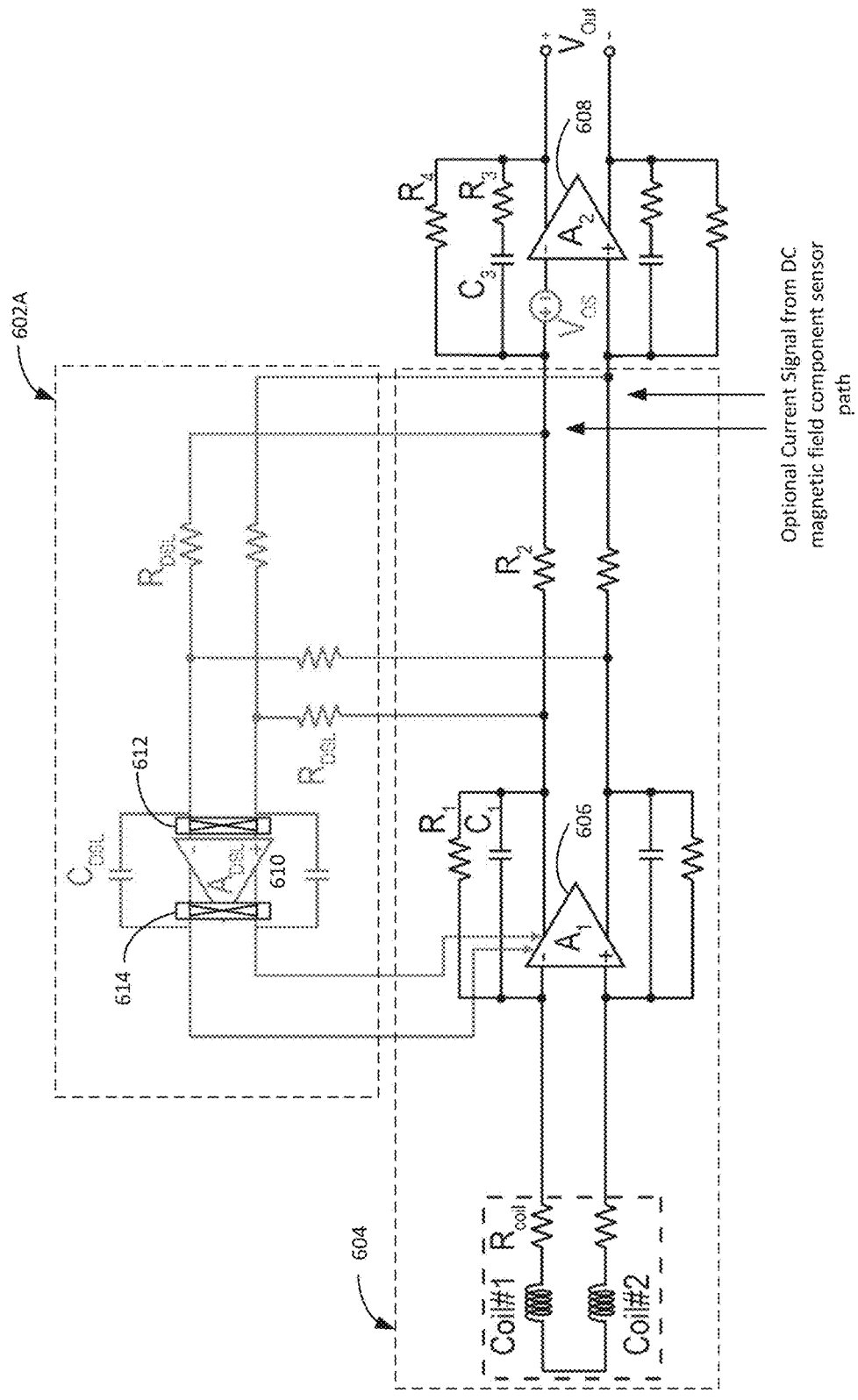
FIGS. 6A-6F illustrate example hybrid magnetic field sensor configurations implementing an analog-based DC component rejection path, in accordance with various embodiments of the disclosure.
Figure 6B:
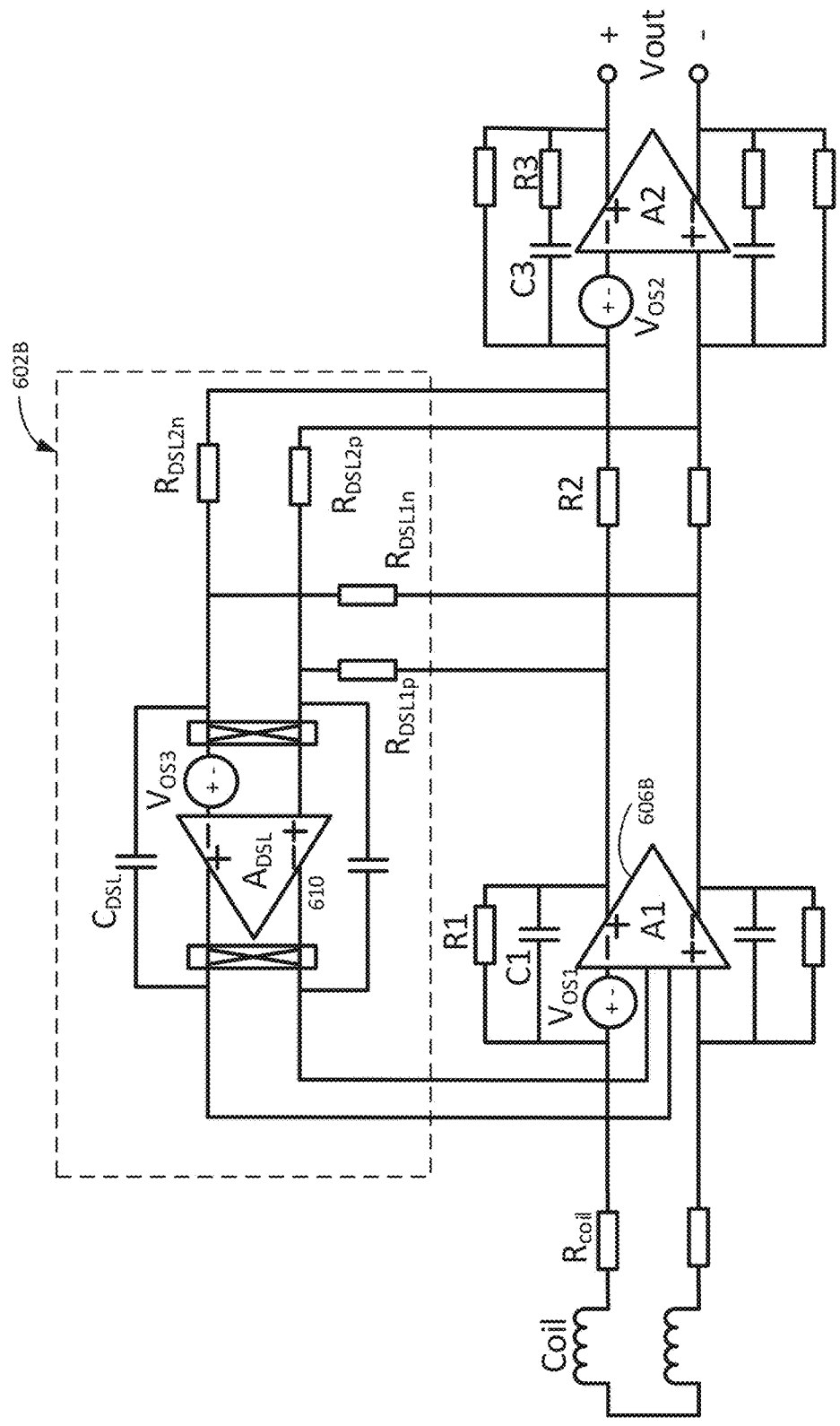

Although not shown in FIGS. 6A-6B for purposes of brevity, the differential current signal output by the pre-amplifier 606 may be combined with a differential current signal generated by a DC magnetic field component sensor path at the input of the output amplifier 208, which generates a differential voltage signal representing the sum of both the high-frequency and the low-frequency magnetic field component measurements. As noted in the previous Section, the embodiments described herein may implement the AC magnetic field component sensor path and the accompanying DC component rejection path as a standalone sensor or as a hybrid sensor that is combined with the DC component rejection path.

In any event, the AC magnetic field component sensor path 604 may provide a current signal having a DC offset value. The embodiments discussed in this Section are directed to the use of an analog DC component rejection path 602 that functions to cancel or to at least reduce the contribution of this DC offset component. Such analog implementations may advantageously allow for a low-noise, high bandwidth, high accuracy, and low DC offset sensors at lower costs. Moreover, the use of an analog DC component rejection path 602 does not introduce cross effects such as cross sensitivity to other directions of the magnetic field, operates without saturation or hysteretic effects, does not suffer from bandwidth limitations such as systems that implement fluxgate or closed loop systems, and includes an overcurrent detection (OCD) function without limiting the accuracy.

To do so, and turning now to FIG. 6A, the pre-amplifier 606 is coupled to the output amplifier 608 via resistors R2. The DC component rejection path 602A implements an amplifier 610, which is coupled to an input chopper switch 612 and an output chopper switch 614, which may each be driven at any suitable frequency depending upon the particular application to cancel or at least reduce the DC offset contribution of the input stage of the amplifier 610 (see FIG. 6B, $V_{OS3}$). Again, although chopper switches are shown and referenced herein with respect to the Figures, this is by way of example and not limitation, and the DC component rejection path 602A may implement alternative components that may be used for this purpose such as e.g. auto-zeroing or correlated double sampling mechanisms.

The amplifier 610 and the chopper switches 612, 614 function as an integrator in conjunction with the resistors RDSL as shown in FIG. 6A. In particular, the differential voltage signal output by the pre-amplifier 606 is converted to a differential voltage across the resistors R2, which is again converted to a differential current signal via the resistors RDSL and fed into the amplifier 610 via the chopper switch 612 (in this example). This enables the integration of a differential current signal that is proportional to the differential current signal output by the pre-amplifier 606. The integration function thus outputs an integrated voltage via the chopper switch 614 that corresponds to an analog differential voltage signal (in this example), which represents the DC offset cancellation signal. The DC offset cancellation signal may then be fed into the pre-amplifier 606 as shown in FIG. 6A to cancel or at least reduce the DC offset component present in the differential current signal output by the pre-amplifier 606. Thus, the DC component rejection path 602A functions as a low pass filter to extract the DC offset components from the differential current signal output by the pre-amplifier 606 (or, in other cases, the high-frequency coil sensor signal), to generate an analog DC offset cancellation signal.

For instance, and turning now to FIG. 6B, the hybrid magnetic field sensor 615 has an identical configuration as the hybrid magnetic field sensor 600 as shown in FIG. 6A. In this embodiment, the pre-amplifier 606B is implemented with a double voltage input stage similar to the pre-amplifier 206E as shown and discussed above with reference to FIG. 2E. Thus, the DC offset compensation signal may be provided to a dedicated input of the DC component rejection path 602A in a similar manner as the differential voltage DAC input is applied to the pre-amplifier 206E as shown in FIG. 2E. Advantageously, it is noted that the DC offsets $V_{OS2}$ and $V_{OS1}$ as shown in FIG. 6B are cancelled in this manner, because the voltage drop Rdrop across the resistors R2 is negligible (substantially equal to 0) and thus only the differential DC voltage offset needs to be cancelled by the DC component rejection path 602B.

Figure 6C:
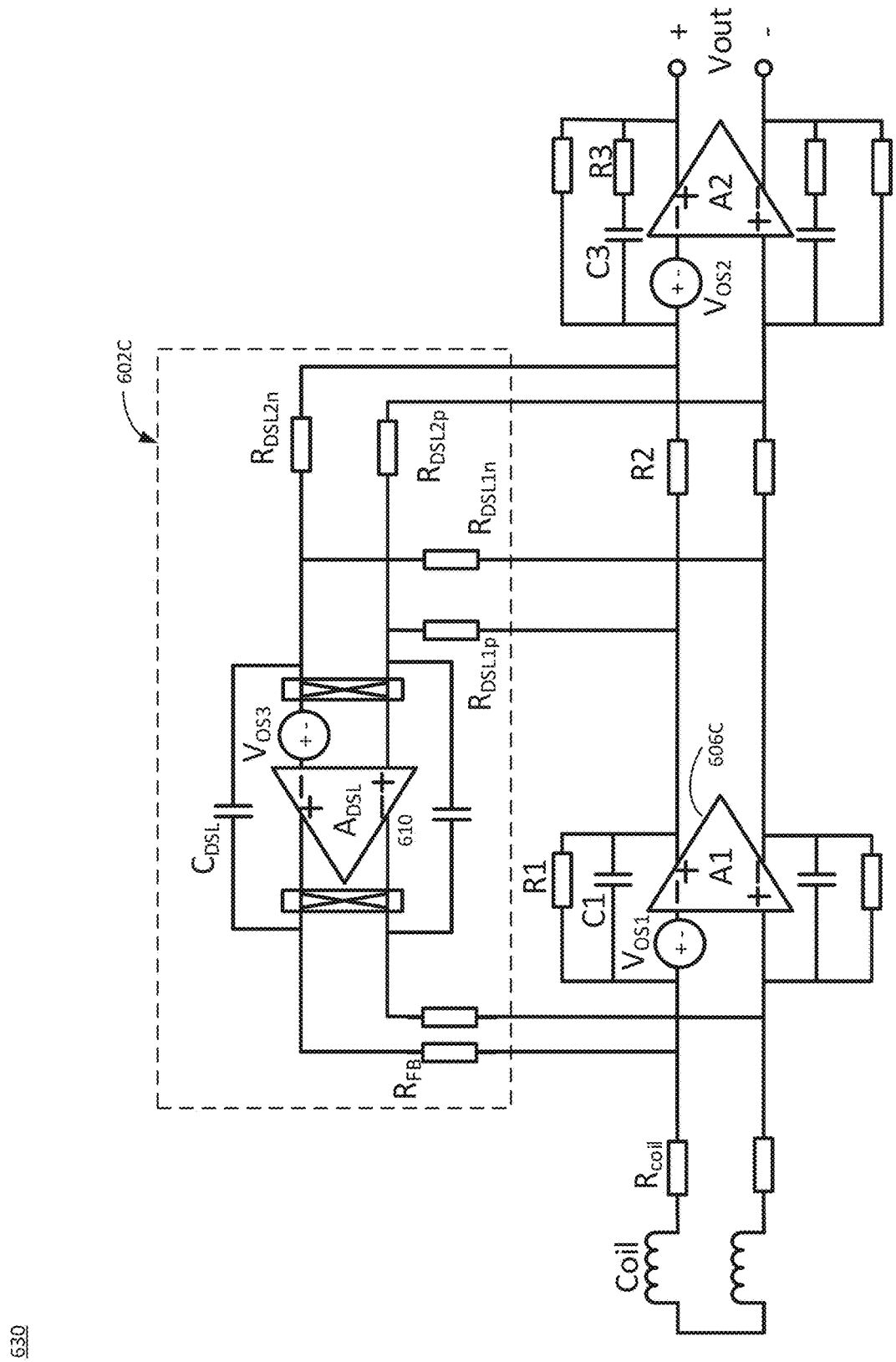

Turning now to FIG. 6C, the hybrid magnetic field sensor 630 has a similar configuration as the hybrid magnetic field sensor 600 as shown in FIG. 6A. However, the DC component rejection path 602C as shown in FIG. 6C includes resistors RFB, which function to convert the analog DC offset cancellation signal from a differential voltage signal to a differential current signal, which is then provided to input of the pre-amplifier 606C as shown in FIG. 6C. Alternatively, the pre-amplifier 606C may be implemented, for instance, as a dual-stage amplifier similar or identical to the pre-amplifier 406C as shown in FIG. 4C. Thus, the pre-amplifier 606C may output a differential current signal and receive the DC offset cancellation signal in the form of a differential current signal at its input. The differential current signal may be received via the input node of the pre-amplifier 606C as shown in FIG. 6C, or via dedicated terminals labeled with the differential current-steering DAC, as shown in FIG. 4C.

Figure 6D:
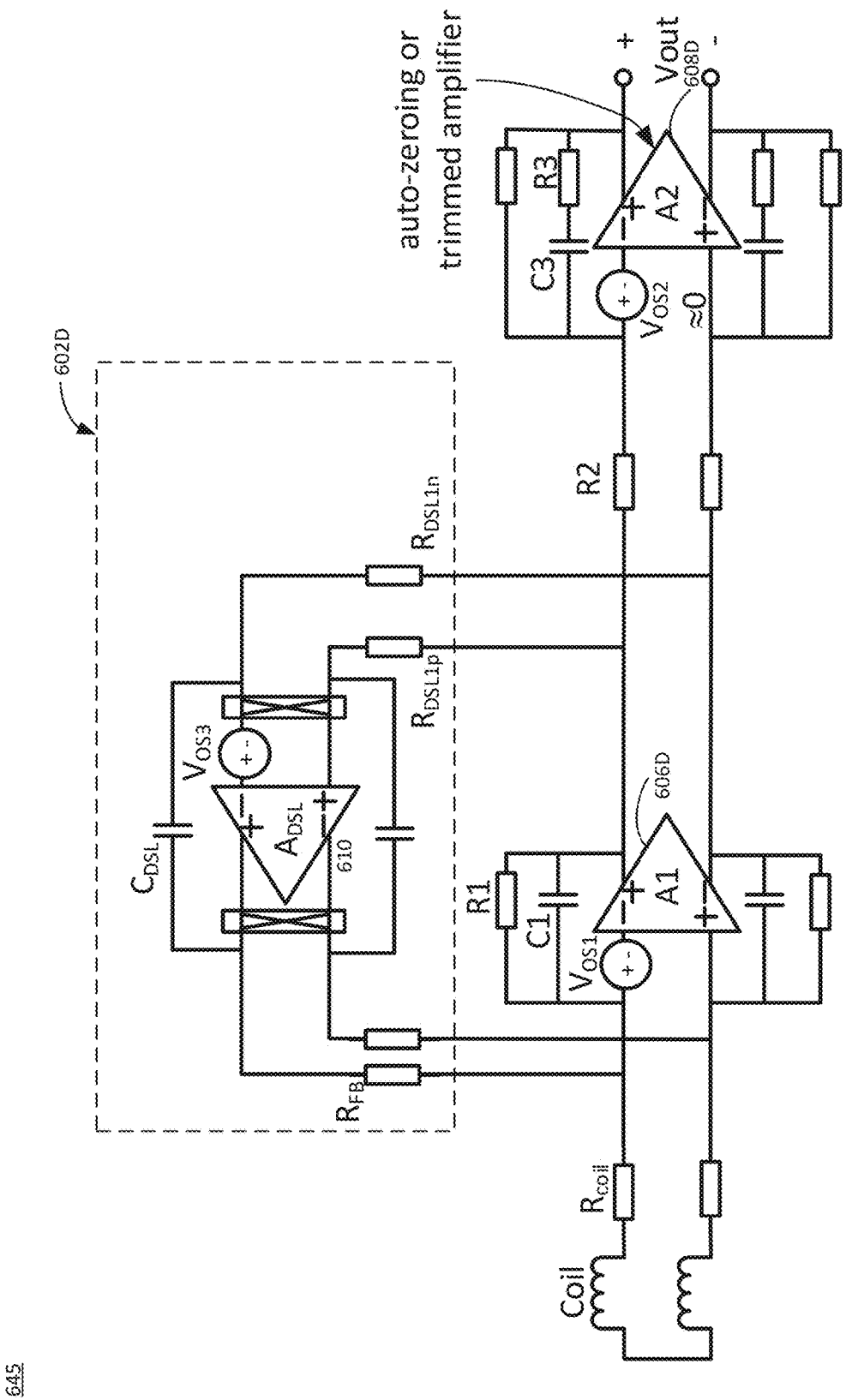

FIG. 6D illustrates a hybrid magnetic field sensor 645 having a similar configuration as the hybrid magnetic field sensor 630 as shown in FIG. 6C. Thus, the pre-amplifier 606D may have an identical configuration as the pre-amplifier 606C, i.e. configured to receive the analog DC offset cancellation signal as a differential current signal. The pre-amplifier 606D may likewise receive the differential current signal via the input node as shown in FIG. 6D or via dedicated current-control terminals, e.g. those labeled with the differential current-steering DAC, as shown in FIG. 4C.

However, the hybrid magnetic field sensor 645 as shown in FIG. 6D comprises a DC component rejection path 602D that is coupled to the AC magnetic field component sensor path 604 at one stage as opposed the two stages as shown in FIG. 6C. For instance, the DC component rejection path 602D is coupled to the output of the pre-amplifier 606D at only one side of the resistors R2. Such a configuration further simplifies the configuration as shown in FIG. 6C, thereby reducing costs. However, in such a configuration the $V_{OS2}$ of the output amplifier 608D is preferably rejected with other means. This may include implementing the output ampliifer 608D as an auto-zeroing or trimmed amplifier, for instance.

Figure 6E:
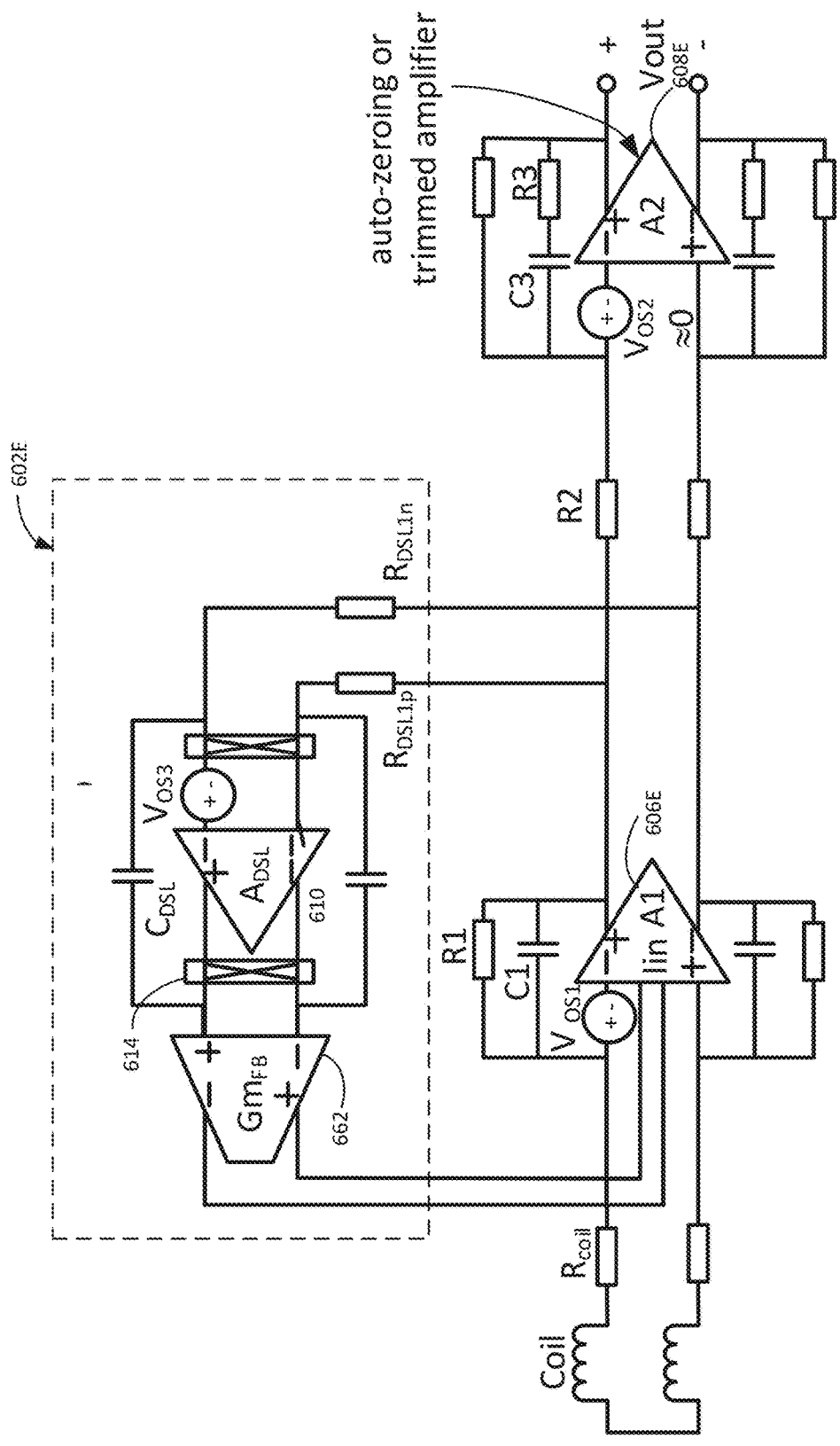

FIG. 6E illustrates a hybrid magnetic field sensor 660 having a similar configuration as the hybrid magnetic field sensor 645 as shown in FIG. 6D. Thus, the pre-amplifier 606E may have an identical configuration as the pre-amplifier 606D, i.e. is configured to receive the analog DC offset cancellation signal as a differential current signal. The hybrid magnetic field sensor 660 as shown in FIG. 6E comprises a DC component rejection path 602E having an input that is coupled to the AC magnetic field component sensor path 604 at one stage as shown in FIG. 6D (i.e. on the pre-amplifier side of the resistors R2), as opposed to the two stages as shown in FIG. 6C (i.e. at each side of the resistors R2). However, this is by way of example and not limitation, and the DC component rejection path 602E may be coupled to any suitable number of stages of the AC magnetic field component sensor path 604.

In any event, the DC component rejection path 602E as shown in FIG. 6E alternatively includes a transconductance amplifier 662 instead of the resistors RFB as shown in FIG. 6D. The transconductance amplifier 662 may be implemented as an operational amplifier-based integrator via the amplifier 610. However, the output of the transconductance amplifier 662 represents a voltage to current conversion as opposed to an integration operation. The use of the transconductance amplifier 662 may be particularly useful, for instance, as such architectures typically take up less space in comparison to the use of larger resistors RFB. However, the transconductance amplifier 662 inserts an additional DC offset into the DC component rejection path 602E. This additional offset may be rejected with a very high open loop-gain, which is primarily provided via the DC-gain of the amplifier 610 in this example.

Thus, the transconductance amplifier 662 is configured to convert the differential voltage signal output by the chopper switch 614 to a differential current signal, which represents the analog DC offset cancellation signal. Again, the analog DC offset cancellation signal is then coupled to the dedicated current control inputs of the pre-amplifier 606E as a differential current signal by way of example, but may alternatively be coupled to the input node of the pre-amplifier 606E in a similar fashion as the pre-amplifiers 606C, 606D. Thus, the analog DC offset cancellation signal functions to at least partially remove the DC offset component from the differential current signal, which would otherwise be output via the pre-amplifier 606E. Furthermore, and as noted above with respect to the hybrid magnetic field sensor 645 as shown in FIG. 6D, the $V_{OS2}$ of the output ampliifer 608E is preferably rejected with other means. Again, this may include implementing the output amplifier 608E as an auto-zeroing or trimmed amplifier, for instance.

Figure 6F:
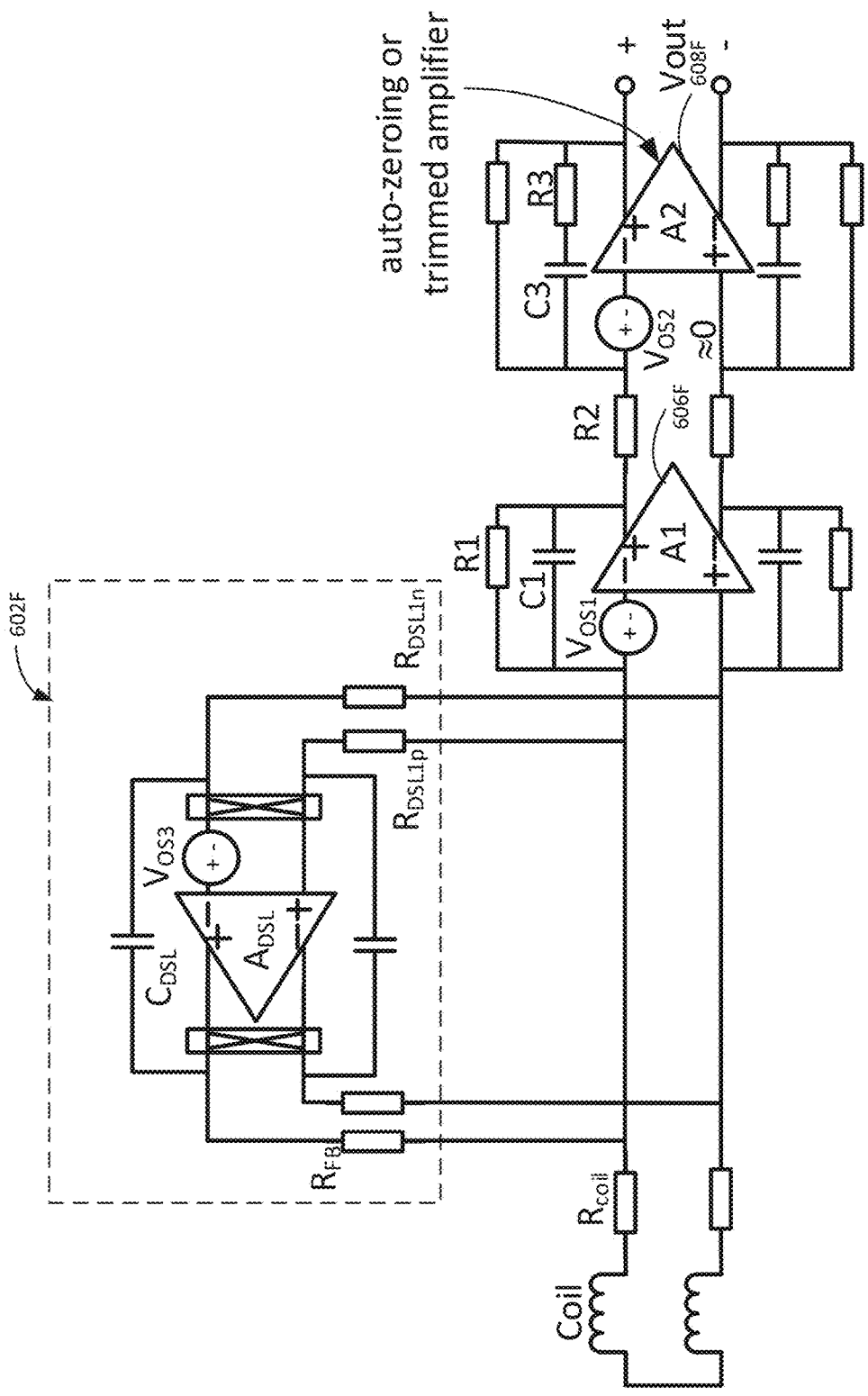

FIG. 6F illustrates a hybrid magnetic field sensor 675 having a similar configuration as the hybrid magnetic field sensor 660 as shown in FIG. 6D. Thus, the pre-amplifier 606F may have an identical configuration as the pre-amplifier 606D, i.e. is configured to receive the analog DC offset cancellation signal as a differential current signal. Again, the analog DC offset cancellation signal is shown as being coupled to the input node of the pre-amplifier 606F in a similar fashion as the pre-amplifiers 606C, 606D, although the analog DC offset cancellation signal may alternatively be coupled to dedicated current control inputs of the pre-amplifier 606F as shown in FIG. 6E.

The hybrid magnetic field sensor 675 as shown in FIG. 6F also comprises a DC component rejection path 602F having an input that is coupled to the AC magnetic field component sensor path 604 at one stage, but in this embodiment the input to the DC component rejection path 602F is coupled to the input of the pre-amplifier 606F as opposed to the output of the pre-amplifier as shown in FIG. 6D. In the present embodiment, the 602F integrates a current signal coupled via the resistors RDSLp, RDSLn as shown in FIG. 6F, which is generated as a result of the high-frequency sensor signal that may be provided as a differential voltage signal as discussed herein. Thus, the analog DC offset cancellation signal is generated in this embodiment as a function of the integration of the input signals of the pre-amplifier 606F versus the output signals of the pre-amplifier 606F. Therefore, the analog DC offset cancellation signal functions to at least partially remove the DC offset component from the differential current signal from the high-frequency coil sensor signal, which would otherwise be output via the pre-amplifier 606F. This embodiment also has advantages as noted in the previous Section in that the DC offset component may further be rejected due to the virtual short-circuit between the input terminals of the pre-amplifier 606F, leading to less demodulation effects. Furthermore, and as noted above, the $V_{OS2}$ of the output ampliifer 608F is preferably rejected using other means, which may be facilitated by implementing the output ampliifer 608F as an auto-zeroing or trimmed amplifier, for instance.

Thus, in accordance with each of the hybrid magnetic field sensor configurations as shown in FIGS. 6A-6E, the DC offset voltage in the differential current signal output by the pre-amplifier 606 is sensed at the input or the output of the pre-amplifier 606. However, it may be particularly useful to detect the DC offset at the pre-amplifier output, because here the amplified offset can be sensed. This detected DC offset is then fed back to the input of the pre-amplifier 606 or to an auxiliary input of the pre-amplifier 606, so that the DC offset voltage is cancelled or at least reduced. Thus, in various embodiments, as further discussed below, there are different ways in which the analog DC offset cancellation signal is implemented to perform the DC offset cancellation or reduction.

For example, and with respect to FIGS. 6A and 6B, a DC offset voltage representing a difference between the DC offset voltage associated with the pre-amplifier 606 and the DC offset voltage associated with the output amplifier 608 (i.e. the difference between VOS1 and VOS2) is canceled out via this configuration. To do so, the DC offset voltage difference between the pre-amplifier 606 and the output amplifier 608 is converted to a current via the resistors RDSL, and then integrated to a voltage via the capacitors CDSL. Moreover, this integrated DC offset value is fed back to the pre-amplifier 606B via an axillary voltage input.

Figure 7B:
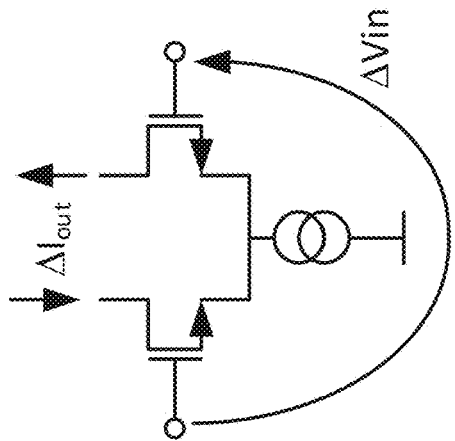
FIGS. 7A-7D illustrate double input stages for amplifiers to receive an input voltage signal and an offset correction (or DC component rejection) signal.
Figure 7A:
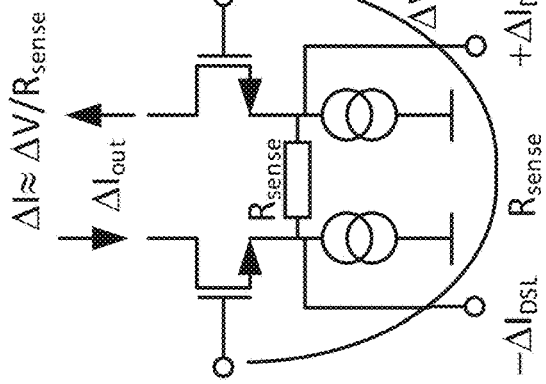
Figure 7D:
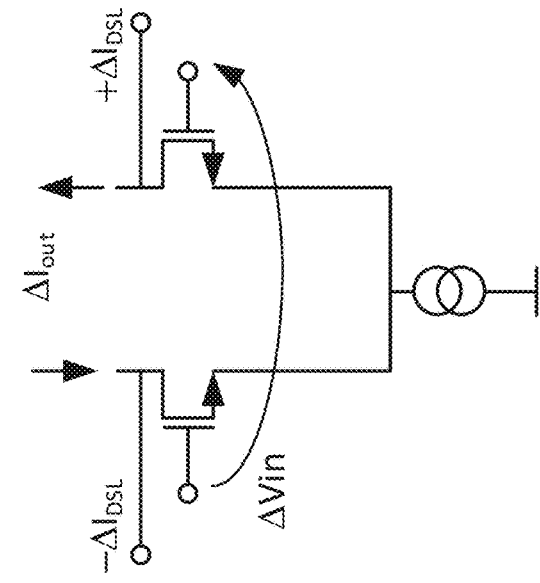
Figure 7C:
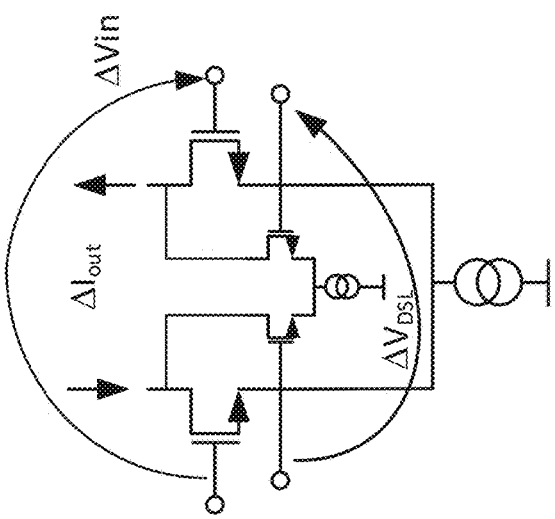

The input stage of the pre-amplifier 606B may be implemented as shown in FIG. 7C as noted in further detail below.

As another example, the hybrid magnetic field sensor configurations as shown in FIG. 6F converts the integrated DC offset voltage to a feedback current via the resistors RFB. This differential feedback current is then converted to a compensation voltage across the resistors R1. The implementation of each of the input stages of the pre-amplifiers 206, 406, 606, etc. as discussed herein are now discussed in further detail below.

FIGS. 7A-7D illustrate double input stages for amplifiers to receive an input voltage signal and an offset correction (or DC component rejection) signal. The architectures as shown in FIGS. 7A-7D may be implemented in accordance with any of the hybrid magnetic field sensors as discussed herein as part of a respective amplifier input stage of the pre-amplifiers 206, 406, 606, etc. For instance, the input stage configurations as discussed with reference to FIGS. 7A-7D may be implemented in accordance with any of the hybrid magnetic field sensor configurations as discussed herein, e.g. for those implementing a digital- or an analog-based DC component rejection path (as discussed in Sections I and II, respectively), as well as those that optionally do not implement an analog-based DC component rejection path (e.g. those described in Section III). The architectures as shown in FIGS. 7A-7D are provided by way of example and not limitation, and the pre-amplifiers discussed herein may implement alternative architectures to facilitate the cancellation or reduction of the DC offset components.

For example, the architectures 700, 780 as shown in FIGS. 7A and 7D may be implemented as an input stage for any of the pre-amplifiers 406C, 606E as shown in FIGS. 4C and 6E, respectively. In each case, the pre-amplifier receives the high-frequency coil sensor signal as a differential voltage signal $\Delta\text{Vin}$, and receives the DC offset cancellation signal as a differential current signal at the terminals $-\Delta\text{IDSL}$ and $+\Delta\text{IDSL}$. Thus, the DC offset cancellation signal functions to provide DC offset correction in this way, resulting in the pre-amplifier 406C, 606E, etc. generating a differential current signal $\Delta\text{Iout}$ that removes or at least reduces the DC offset components that would otherwise be present.

As another example, the architecture 720 as shown in FIG. 7B may be implemented as an input stage for any of the pre-amplifiers 206, 606 as shown in FIGS. 2A, 2C, 2D, 3A, 4A, 4B, 6C, 6D, 6F, etc. In each case, the $\Delta\text{Vin}$ terminals may be identified with high-frequency coil sensor signal that is received as a differential voltage signal.

As another example, the architecture 740 as shown in FIG. 7C may be implemented as an input stage for any of the pre-amplifiers 206, 606 as shown in FIGS. 2E, 6A, 6B etc. In each case, the $\Delta\text{Vin}$ terminals may be identified with high-frequency coil sensor signal that is received as a differential voltage signal. Moreover, in accordance with such implementations the pre-amplifier received the DC offset cancellation signal as a differential voltage signal at the terminals $-\Delta\text{VDSL}$ and $+\Delta\text{VDSL}$. Thus, the DC offset cancellation signal functions to provide DC offset correction in this way, resulting in the pre-amplifier 206E, 606, 606B, etc. generating a differential current signal $\Delta\text{Iout}$ that removes or at least reduces the DC offset components that would otherwise be present.

As noted above for the digital-based embodiments as described in Section I, it is noted that the analog-based embodiments as described in this Section likewise benefit from a direct coupling between the high-frequency magnetic field sensor and the pre-amplifier in the AC magnetic field component sensor path. That is, a direct connection between the high-frequency magnetic field sensor and the pre-amplifier in the AC magnetic field component sensor path may be implemented via the coil resistors Rcoil for the analog-based embodiments in this Section in the same manner as the digital-based embodiments as described in Section I. Again, this is a result of the use of the DC component cancellation signal to perform cancellation or reduction of the DC offset that would otherwise be contained in the signal coupled to the pre-amplifier via the high-frequency magnetic field sensor elements.

Various examples of hybrid magnetic field sensors are described above with respect to FIGS. 6A-6F. These configurations are by way of example and not limitation, and any features of these various architectures may be combined with one another. For example, any of the hybrid magnetic field sensors as shown in FIG. 6A-6F may implement pre-amplifiers 606 having any suitable configuration, and implement DC component rejection paths that generate a DC component cancellation signal as a differential current signal or a differential voltage signal in accordance with the configuration of the pre-amplifier 606. To provide another example, any of the hybrid magnetic field sensors as described above with respect to FIGS. 6A-6F may implement DC component rejection paths that include amplifiers and/or transconductance integrators. Combinations of any of these aforementioned parameters may be combined to yield further embodiments.

Furthermore, each of the embodiments as described herein may be implemented as a hybrid magnetic field sensor or as a hybrid current sensor, from which measurements magnetic field measurements may be calculated, depending upon the particular application. For example, the hybrid magnetic field sensor may be implemented to perform high-speed position measurements. Moreover, and due to the optional elimination of the bypass capacitors as noted herein, the embodiments described herein may obviate the need for external components such as those that are typically used with conventional hybrid magnetic field sensor devices (e.g. as shown in FIG. 1). Thus, for the DC component rejection paths implemented for the digital-based (e.g. in Section I) and analog-based (e.g. in Section II) embodiments, the DC component rejection paths may be incorporated onto a common sensor chip, integrated circuit, system-on-a-chip (Soc), etc., with the other components identified with the AC magnetic field component and the DC component rejection path sensor paths. Thus, any of the hybrid magnetic field sensors as discussed herein may be implemented on a single integrated device with their respective DC component rejection paths without the need to use external components or dedicated pins for such connections. This saves cost and simplifies manufacturing.

Still further, the embodiments as shown herein with respect to the various implementations of the DC component rejection paths are provided by way of example and not limitation. For instance, the DC component rejection path may implement a CT-$\Sigma\Delta$ ADC. However, and as discussed above, in other embodiments the DC component rejection path may additionally or alternatively implement other components such as an analog integrator or low-pass filter, which may be trimmed to provide a minimized DC offset contribution. The DC component rejection path may utilize dynamic DC offset cancellation techniques that may include chopping, correlated double-sampling, autozeroing, or dynamic element matching. These techniques may be implemented in accordance with any suitable architectures and/or components, including known techniques of implementation.

III. Implementation of a Hybrid Tunnel Magneto-Resistance (XMR) and Vertical Hall Sensor The previous Sections described embodiments of hybrid magnetic field sensors that implement DC component rejection paths using digital-based (e.g. in Section I) and analog-based (e.g. in Section II) solutions. In each of these embodiments in which both an AC and a DC magnetic field component sensor path is present, the magnetic field component sensor path is shown implementing coil-based sensor elements, whereas the DC magnetic field component sensor path is shown implementing Hall sensor elements. However, the embodiments are not limited in this regard, and any suitable type of sensor may be implemented for each respective path.

For instance, the Hall sensor elements and/or the coil sensor elements may be implemented as vertical Hall probes and/or lateral Hall plates, horizontal Hall probes and/or Hall plates, spinning vertical Hall sensors, magneto resistors (e.g. taking advantage of the anisotropic magnetoresistance (AMR), the giant magnetoresistance (GMR), or the tunnel magnetoresistance (TMR)), etc.

However, a hybrid magnetic field sensor that implements a spinning vertical Hall sensor for the DC magnetic field component sensor path and an XMR (i.e. an AMR, GMR, TMR, or any other suitable magneto-resistive sensor) for the AC magnetic field component sensor path may be particularly useful in accordance with the embodiments as described herein. For instance, it is desirable for hybrid magnetic field sensors used for magnetic current sensing and/or position measurements to have a high accuracy (i.e. a low DC offset). This results in advantageous such as a low zero point error, a low zero current error, high bandwidth (~1 MHz), low noise (<0.1% FS), and allows for magnetic sensitivity directions parallel to the chip surface. Still further, the low noise from XMR sensors is often accompanied with a relatively high DC offset, DC offset drift, and stability issues. The hybrid magnetic field sensors as discussed in the Sections I and II above may remedy the known issues related to the use of XMR sensors in this context by way of the accuracy afforded through the aforementioned DC offset cancellation techniques.

The combination of spinning vertical Hall sensor elements and XMR sensor elements in this manner advantageously yields a low DC offset (e.g. less than <300 μT) via the spinning vertical Hall sensor elements, as well as the low noise and high frequency and bandwidth (e.g. in excess of 1 MHz) provided by via the XMR sensor elements. Again, such implementations are particularly useful for the detection of lateral (e.g. parallel to the chip surface) magnetic signals.

Figure 8:
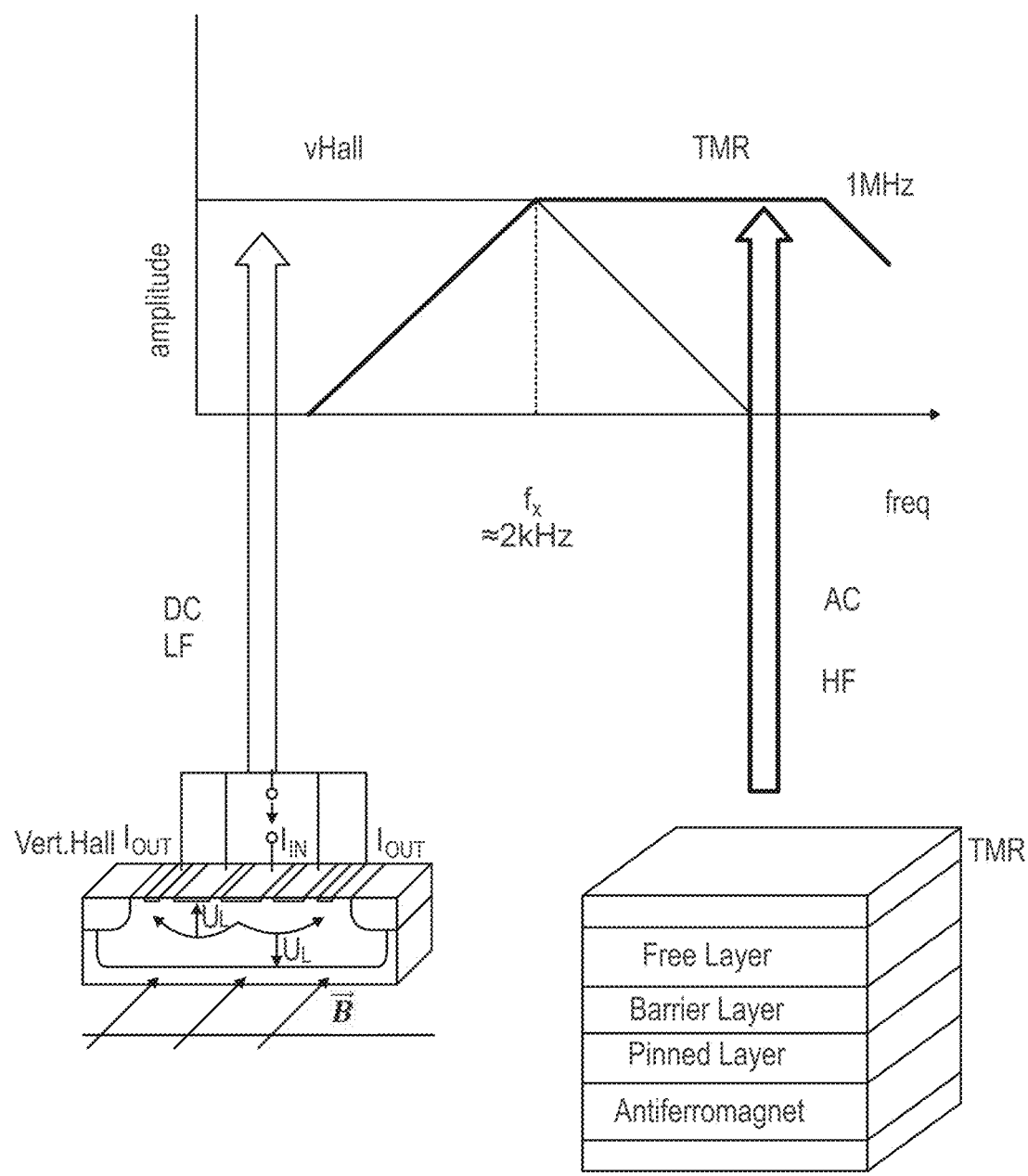
FIG. 8 illustrates a frequency response comparison between vertical Hall sensors and XMR sensors, which may be implemented with hybrid magnetic field sensor configurations, in accordance with an embodiment of the disclosure.

To further illustrate the benefit of using the XMR sensor elements in conjunction with spinning vertical Hall sensor elements, FIG. 8 illustrates a frequency response comparison between vertical Hall sensor elements and XMR sensor elements, which may be implemented with hybrid magnetic field sensor embodiments as discussed herein. FIG. 8 demonstrates that the XMR sensors used in the AC magnetic field component sensor path have a high pass frequency response, whereas the vertical Hall sensors used in the DC magnetic field component sensor path have a low pass frequency response. In the example as shown in FIG. 8, two frequency responses are shown superimposed onto one another.

In particular, the DC magnetic field component sensor path is identified with the low-pass frequency response to enable the measurement of DC and low-frequency magnetic field components within a range of frequencies up to a cutoff frequency, which may be alternatively referred to as a crossover frequency. This is also the case for the DC magnetic field component sensor paths as noted above in Sections I and II. However, when spinning vertical Hall sensors are implemented via the DC magnetic field component sensor path, the bandwidth of the low-pass response is significantly increased. For instance, the low-pass response cutoff frequency for the DC magnetic field component sensor path when spinning vertical Hall sensors are implemented is represented in FIG. 8 as a frequency $f_x$ that is identified with a drop in amplitude of any suitable value, such as −3 dB for instance. In contrast, when Hall plate elements are implemented as part of the DC magnetic field component sensor path as illustrated in Sections I and II above, the low-pass response cutoff frequency may be e.g. one half, one-third, one-quarter, etc. of the low-pass response cutoff frequency $f_x$ as shown in FIG. 8, which is about 2 kHz (e.g. ±1%, 5%, 10%, etc.) in this example.

Furthermore, the AC magnetic field component sensor path is identified with the high-pass frequency response to enable the measurement of higher-frequency magnetic field components within a range of frequencies down to a cutoff frequency, which again may be alternatively referred to as a crossover frequency. This is also the case for the AC magnetic field component sensor paths as noted above in Sections I and II. However, when XMR sensors are implemented via the AC magnetic field component sensor path, the bandwidth of the high-pass response is also significantly increased. For instance, the high-pass response cutoff frequency for the AC magnetic field component sensor path when XMR sensors are implemented is represented in FIG. 8 as the frequency $f_x$ that is identified with a drop in amplitude of any suitable value, such as −3 dB for instance.

In contrast, when coil sensor elements are implemented as part of the AC magnetic field component sensor path as illustrated in Sections I and II above, the high-pass response cutoff frequency may be e.g. one half, one-third, one-quarter, etc. of the high-pass response cutoff frequency $f_x$ as shown in FIG. 8. It is noted that the low-pass response cutoff frequency and the high-pass response cutoff frequency as shown in FIG. 8 are both equal to one another, i.e. $f_x$, which is preferred to optimize the operating bandwidth of the hybrid magnetic field sensor. However, in other embodiments the low-pass response cutoff frequency and the high-pass response cutoff frequency may deviate from one another, e.g. when magnetic field components in a particular range of frequencies does not need to be readily detected.

Therefore, given the significant improvement in bandwidth performance of the XMR sensor and the spinning vertical Hall sensor, the DC component rejection path as discussed above with reference to Sections I and II is optional for such implementations. Moreover, in such cases the DC blocking capacitors as discussed herein with reference to FIG. 1 may alternatively be used to provide a more economical solution than the use of the additional components for the digital- or analog-based DC component rejection path. Of course, the DC component rejection path may still be implemented in conjunction with the XMR sensor and the spinning vertical Hall sensor to provide additional accuracy when desired. Thus, the decision to implement the DC component rejection path versus the DC blocking capacitors may be based upon the particular application, desired performance, and budgetary considerations.

Figure 9A:
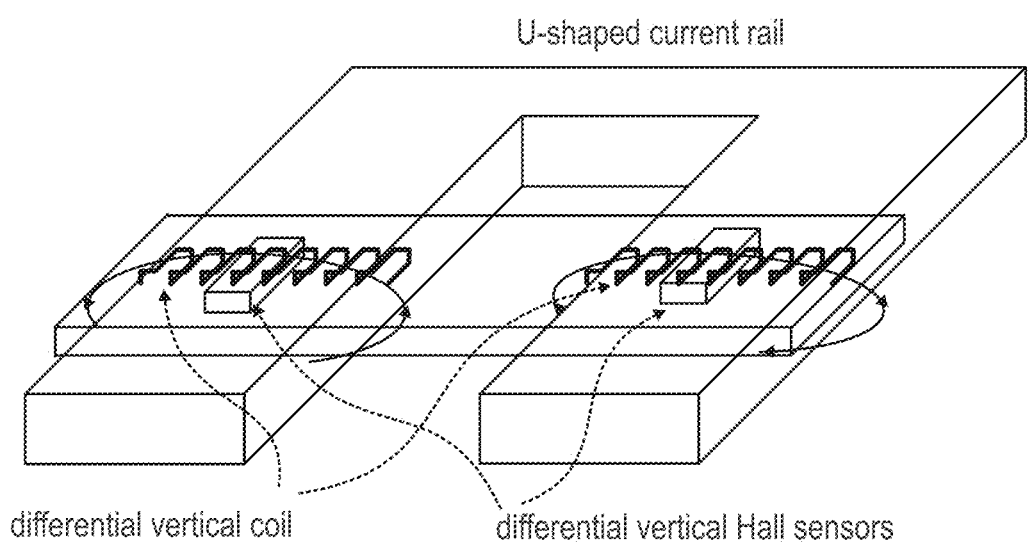
FIG. 9A illustrates a physical implementation of conventional vertical Hall sensors and vertical coil sensors as part of a hybrid magnetic field sensor configuration.

FIG. 9A illustrates a physical implementation of conventional vertical Hall sensors and vertical coil sensors as part of a hybrid magnetic field sensor configuration. As shown in FIG. 9A, a U-shaped current rail is shown onto which the sensor elements are disposed. The U-shaped current rail and the accompanying sensor elements as shown in FIG. 9A may also be integrated as part of a hybrid magnetic field sensor, such as those discussed herein with reference to Sections I and II for instance. The integrated hybrid magnetic field sensor 900 as shown in FIG. 9A may also form part of a discrete integrated circuit package or chip. Therefore, the integrated hybrid magnetic field sensor 900 as shown in FIG. 9A may be implemented as part of an integrated package or chip such that the current rail is mounted parallel with the chip surface, and thus enable the detection of lateral (e.g. parallel to the chip surface) magnetic fields.

The integrated hybrid magnetic field sensor 900 as shown in FIG. 9A implements differential vertical coil elements on one arm of the U-shaped current rail, and the differential signals produced thereby may be coupled to the input of the pre-amplifier included as part of the AC magnetic field component sensor path as discussed above in Sections I and II. The other arm of the U-shaped current rail implements a differential vertical Hall sensor element configuration, with the differential signals produced thereby being coupled to the input of the pre-amplifier included as part of the DC magnetic field component sensor path as discussed above in Sections I and II. Again, the use of the differential mode may be particularly useful to suppress stray magnetic fields, although this is provided by way of example and not limitation.

Figure 9B:
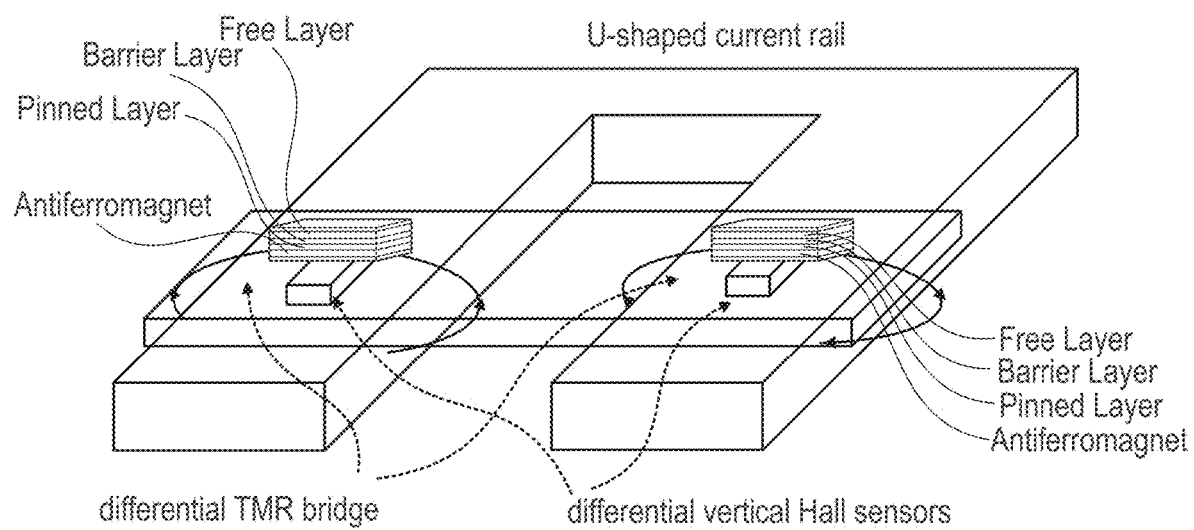
FIG. 9B illustrates a physical implementation of vertical Hall sensors and XMR sensors as part of a hybrid magnetic field sensor configuration, in accordance with an embodiment of the disclosure.

FIG. 9B illustrates a physical implementation of vertical Hall sensors and XMR sensors as part of a hybrid magnetic field sensor configuration, in accordance with an embodiment of the disclosure. As shown in FIG. 9B, the hybrid magnetic field sensor configuration 950 also implements a U-shaped current rail is shown onto which the sensor elements are disposed. The U-shaped current rail and the accompanying sensor elements may be integrated as part of a hybrid magnetic field sensor, such as those discussed herein with reference to Sections I and II for instance. As one illustrative example, such an integrated hybrid magnetic field sensor may form part of a discrete integrated circuit package or chip. Thus, the configuration as shown in FIG. 9B may be implemented as part of an integrated package or chip such that the current rail is mounted parallel with the chip surface, and thus enable the detection of lateral (e.g. parallel to the chip surface) magnetic fields.

However, the hybrid magnetic field sensor configuration 950 as shown in FIG. 9B differs from that shown in FIG. 9A via the use of a differential XMR bridge versus differential vertical coil elements. In particular, the hybrid magnetic field sensor configuration 950 as shown in FIG. 9B implements a differential XMR bridge on one arm of the U-shaped current rail, and the differential signals produced thereby may be coupled to the input of the pre-amplifier included as part of the AC magnetic field component sensor path as discussed above in Sections I and II. The other arm of the U-shaped current rail implements a differential vertical Hall sensor element configuration, with the differential signals produced thereby being coupled to the input of the pre-amplifier included as part of the DC magnetic field component sensor path as discussed above in Sections I and II. Although the use of differential signaling is primarily described herein, this is by way of example and not limitation. However, the use of the differential mode may be particularly useful to suppress stray magnetic fields.

Although either of the hybrid magnetic field sensor configuration 900, 950 as shown in FIGS. 9A and 9B, respectively, may benefit from the use of the DC cancellation path as discussed herein in Sections I and II, the use of the XMR bridge for the hybrid magnetic field sensor configuration 950 may enable a greater bandwidth of operation and optionally forego the use of the DC cancellation path and alternatively implement DC blocking capacitors.

EXAMPLES

The techniques of this disclosure may also be described in the following examples.

Example 1. A magnetic field sensor, comprising: an alternating current (AC) magnetic field component sensor path configured to output a first current signal based upon a received first sensor signal corresponding to a measured magnetic field within a first frequency range; an amplifier configured to output a voltage signal based upon the first current signal, the voltage signal corresponding to the measured magnetic field within the first frequency range; and a direct current (DC) component rejection path including digital integration circuitry, the DC component rejection path being configured to generate a DC component cancellation signal that is based upon a continuous time-averaging of one of (i) the first current signal, or (ii) the first sensor signal, wherein the DC component cancellation signal is coupled to the AC magnetic field component sensor path to at least partially cancel a DC component in one of (i) the first current signal, or (ii) the first sensor signal, that was continuously time-averaged.

Example 2. The magnetic field sensor of Example 1, further comprising: a DC magnetic field component sensor path configured to output a second current signal based upon a second sensor signal corresponding to measured magnetic field within a second frequency range that is less than the first frequency range, wherein the amplifier is configured to output the voltage signal based upon a summation of the first current signal and the second current signal such that the voltage signal corresponds to the measured magnetic field within the first frequency range and the measured magnetic field within the second frequency range.

Example 3. The magnetic field sensor of any combination of Examples 1-2, wherein the AC magnetic field component sensor path is configured to receive the first sensor signal via one or more coil sensor elements, and wherein the DC magnetic field component sensor path is configured to receive the second sensor signal via one or more Hall sensor elements.

Example 4. The magnetic field sensor of any combination of Examples 1-3, wherein the DC component rejection path includes an input and an output, each of the input and the output of the DC component rejection path being coupled to different respective stages within the AC magnetic field component sensor path.

Example 5. The magnetic field sensor of any combination of Examples 1-4, wherein the DC component rejection path includes an input and an output, each of the input and the output of the DC component rejection path being coupled to the same stage within the AC magnetic field component sensor path.

Example 6. The magnetic field sensor of any combination of Examples 1-5, wherein the DC component rejection path comprises: a continuous time sigma-delta (CT-ΣΔ) analog-to-digital converter (ADC) configured to generate digital data based upon one of (i) the first current signal, or (ii) the first sensor signal, and wherein the digital integration circuitry is configured to perform a digital integration of the digital data to output a digital representation of the DC component cancellation signal based upon the one of (i) the first current signal, or (ii) the first sensor signal, from which the digital data was generated.

Example 7. The magnetic field sensor of any combination of Examples 1-6, wherein the DC component rejection path further comprises: a digital to analog converter (DAC) configured to convert the digital representation of the DC component cancellation signal to a differential current signal that comprises the DC component cancellation signal.

Example 8. The magnetic field sensor of any combination of Examples 1-7, further comprising: a quantization noise reduction path configured to generate a quantization noise cancellation signal based upon a clock signal used by the CT-ΣΔ ADC, and to provide the quantization noise cancellation signal at one or more nodes of the AC magnetic field component sensor path to at least partially cancel quantization noise introduced into the digital representation of the DC component cancellation signal.

Example 9. The magnetic field sensor of any combination of Examples 1-8, wherein the quantization noise reduction path is configured to provide the quantization noise cancellation signal at an input of the amplifier to at least partially cancel quantization noise introduced into the digital representation of the DC component cancellation signal.

Example 10. The hybrid magnetic field sensor of any combination of Examples 1-9, wherein the quantization noise reduction path further comprises a 1-bit digital-to-analog converter (DAC) configured to generate the quantization noise cancellation signal based upon digital data output via a counter that is coupled to an output of the digital integration circuitry.

Example 11. The magnetic field sensor of any combination of Examples 1-10, wherein the AC magnetic field component sensor path is configured to receive the first sensor signal via a XMR sensor, and wherein the DC magnetic field component sensor path is configured to receive the second sensor signal via a vertical Hall sensor.

Example 12. A hybrid magnetic field sensor, comprising: a first magnetic field component sensor path configured to output a first current signal based upon a received first sensor signal corresponding to a measured magnetic field component within a first frequency range; a second magnetic field component sensor path configured to output a second current signal based upon a received second sensor signal corresponding to a measured magnetic field component within a second frequency range, the second frequency range being greater than the first frequency range; a first amplifier configured to output a voltage signal based upon a summation of the first current signal and the second current signal such that the voltage signal corresponds to the measured magnetic field within the first frequency range and the measured magnetic field within the second frequency range; and a direct current (DC) component rejection path configured to generate a DC component cancellation signal that is based upon a continuous time-averaging of one of (i) the second current signal, or (ii) the second sensor signal, wherein the DC component cancellation signal is coupled to the second magnetic field component sensor path to at least partially cancel a DC component in one of (i) the second current signal, or (ii) the second sensor signal, that was continuously time-averaged.

Example 13. The hybrid magnetic field sensor of Example 12, wherein: the first magnetic field component sensor path is configured to receive the first voltage signal via one or more Hall sensor elements, the second magnetic field component sensor path is configured to receive the second voltage signal via one or more coil sensor elements, and the DC component rejection path includes an input and an output, each of the input and the output of the DC component rejection path being coupled to different respective stages within the second magnetic field component sensor path.

Example 14. The hybrid magnetic field sensor of any combination of Examples 12-13, wherein: the first magnetic field component sensor path is configured to receive the first voltage signal via one or more Hall sensor elements, the second magnetic field component sensor path is configured to receive the second voltage signal via one or more coil sensor elements, and the DC component rejection path includes an input and an output, each of the input and the output of the DC component rejection path being coupled to the same stage within the second magnetic field component sensor path.

Example 15. The hybrid magnetic field sensor of any combination of Examples 12-14, wherein the DC component rejection path comprises: a continuous time sigma-delta (CT-ΣΔ) analog-to-digital converter (ADC) configured to generate digital data based upon one of (i) the second current signal, or (ii) the second sensor signal; and digital integration circuitry configured to perform a digital integration of the digital data to output a digital representation of the DC component cancellation signal based the one of (i) the second current signal, or (ii) the second sensor signal, from which the digital data was generated.

Example 16. The hybrid magnetic field sensor of any combination of Examples 12-15, wherein the DC component rejection path further comprises: a digital to analog converter (DAC) configured to convert the digital representation of the DC component cancellation signal to a differential current signal that comprises the DC component cancellation signal.

Example 17. The hybrid magnetic field sensor of any combination of Examples 12-16, further comprising: a quantization noise reduction path configured to generate a quantization noise cancellation signal based upon a clock signal used by the CT-ΣΔ ADC, and to provide the quantization noise cancellation signal at one or more nodes of the second magnetic field component sensor to at least partially cancel the quantization noise.

Example 18. The hybrid magnetic field sensor of any combination of Examples 12-17, wherein the quantization noise reduction path is configured to provide the quantization noise cancellation signal at an input of the amplifier to at least partially cancel quantization noise introduced into the digital representation of the DC component cancellation signal.

Example 19. The hybrid magnetic field sensor of any combination of Examples 12-18, wherein the quantization noise reduction path further comprises a 1-bit digital-to-analog converter (DAC) configured to generate the quantization noise cancellation signal based upon digital data output via a counter that is coupled to an output of the digital integration circuitry.

Example 20. The hybrid magnetic field sensor of any combination of Examples 12-19, wherein the first magnetic field component sensor path is configured to receive the first sensor signal via a vertical Hall sensor, and wherein the second magnetic field component sensor path is configured to receive the second sensor signal via a XMR sensor.

Example 21. A hybrid magnetic field sensor, comprising: a first magnetic field component sensor path configured to output a first current signal based upon a received first sensor signal corresponding to a measured magnetic field component within a first frequency range; a second magnetic field component sensor path configured to output a second current signal based upon a received second sensor signal corresponding to a measured magnetic field component within a second frequency range, the second frequency range being greater than the first frequency range; a first amplifier configured to output a voltage signal based upon a summation of the first current signal and the second current signal such that the voltage signal corresponds to the measured magnetic field within the first frequency range and the measured magnetic field within the second frequency range; and a direct current (DC) component rejection path configured to generate a DC component cancellation signal by performing an analog integration of a third current signal that is based upon one of (i) the second current signal, or (ii) the second sensor signal, wherein the DC component cancellation signal is coupled to the second magnetic field component sensor path to at least partially cancel a DC component in one of (i) the second current signal, or (ii) the second sensor signal, that corresponds to the third current signal that was analog integrated.

Example 22. The hybrid magnetic field sensor of Example 21, wherein the analog components comprise an amplifier configured to perform the analog integration to generate a differential voltage signal as the DC component cancellation signal.

Example 23. The hybrid magnetic field sensor of any combination of Examples 21-22, wherein the analog components comprise an amplifier configured to perform the analog integration to generate a differential voltage signal, and a transconductance integrator configured to convert the differential voltage signal to a differential current signal as the DC component cancellation signal.

Example 24. The hybrid magnetic field sensor of any combination of Examples 21-23, wherein the DC component rejection path includes an input and an output, each of the input and the output of the DC component rejection path being coupled to different respective stages within the second magnetic field component sensor path.

Example 25. A hybrid magnetic field sensor, comprising: a first magnetic field component sensor path coupled to a vertical Hall sensor and configured to output a first current signal based upon a magnetic field component measured by the vertical Hall sensor within a first frequency range; a second magnetic field component sensor path coupled to a an XMR sensor and configured to output a second current signal based upon a magnetic field component measured by the XMR sensor within a second frequency range; and a first amplifier configured to output a voltage signal based upon a summation of the first current signal and the second current signal, wherein the second frequency range is greater than the first frequency range, and wherein a cutoff frequency for the first frequency range is substantially equal to a cutoff frequency for the second frequency range.

Example 26. A hybrid magnetic field sensor, comprising: a first magnetic field component sensor path coupled to a vertical Hall sensor and configured to output a first current signal based upon a magnetic field component measured by the vertical Hall sensor within a first frequency range; a second magnetic field component sensor path coupled to a vertical coil sensor and configured to output a second current signal based upon a magnetic field component measured by the vertical coil sensor within a second frequency range; and a first amplifier configured to output a voltage signal based upon a summation of the first current signal and the second current signal, wherein the second frequency range is greater than the first frequency range, and wherein a cutoff frequency for the first frequency range is substantially equal to a cutoff frequency for the second frequency range.

CONCLUSION

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that specific terms used in the description and claims may be interpreted in a very broad sense. For example, the terms "circuit" or "circuitry" used herein are to be interpreted in a sense not only including hardware but also software, firmware or any combinations thereof. The term "data" may be interpreted to include any form of representation data. The term "information" may in addition to any form of digital information also include other forms of representing information. The term "entity" or "unit" may in embodiments include any device, apparatus circuits, hardware, software, firmware, chips, or other semiconductors as well as logical units or physical implementations of protocol layers etc. Furthermore, the terms "coupled" or "connected" may be interpreted in a broad sense not only covering direct but also indirect coupling.

It is further to be noted that methods disclosed in the specification or in the claims may be implemented by a device having means for performing each of the respective steps of these methods.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A magnetic field sensor, comprising:
    an alternating current (AC) magnetic field component sensor path configured to output a first current signal based upon a received first sensor signal corresponding to a measured magnetic field within a first frequency range;
    an amplifier configured to output a voltage signal based upon the first current signal, the voltage signal corresponding to the measured magnetic field within the first frequency range; and
    an analog direct current (DC) component rejection path including analog integration circuitry, the analog DC component rejection path being configured to generate a DC component cancellation signal that comprises an analog signal and is based upon an integration function that is applied, via the analog integration circuitry, to one of (i) the first current signal, or (ii) the first sensor signal,
    wherein the DC component cancellation signal is coupled to the AC magnetic field component sensor path to at least partially cancel a DC component in one of (i) the first current signal, or (ii) the first sensor signal, that was analog integrated.

2. The magnetic field sensor of claim 1, further comprising:
    a DC magnetic field component sensor path configured to output a second current signal based upon a second sensor signal corresponding to a measured magnetic field within a second frequency range that is less than the first frequency range.

3. The magnetic field sensor of claim 2, wherein the amplifier is configured to output the voltage signal based upon a summation of the first current signal and the second current signal such that the voltage signal corresponds to the measured magnetic field within the first frequency range and the measured magnetic field within the second frequency range.

4. The magnetic field sensor of claim 2, wherein the AC magnetic field component sensor path is configured to receive the first sensor signal via one or more coil sensor elements, and
    wherein the DC magnetic field component sensor path is configured to receive the second sensor signal via one or more Hall sensor elements.

5. The magnetic field sensor of claim 1, wherein the analog DC component rejection path includes an input and an output, each of the input and the output of the DC component rejection path being coupled to different respective stages within the AC magnetic field component sensor path.

6. The magnetic field sensor of claim 1, wherein the analog DC component rejection path includes an input and an output, each of the input and the output of the DC component rejection path being coupled to the same stage within the AC magnetic field component sensor path.

7. The magnetic field sensor of claim 6, further comprising:
a pre-amplifier coupled to the amplifier, the pre-amplifier being configured to receive the first sensor signal,
wherein the same stage within the AC magnetic field component sensor path to which each of the input and the output of the DC component rejection path are coupled within the AC magnetic field component sensor path comprises an input of the pre-amplifier.

8. The magnetic field sensor of claim 1, wherein the analog DC component rejection path comprises a further amplifier configured to perform the analog integration to generate a differential voltage signal as the DC component cancellation signal.

9. The magnetic field sensor of claim 8, wherein the analog DC component rejection path further comprises:
a transconductance integrator configured to convert the differential voltage signal to a differential current signal as the DC component cancellation signal.

10. The magnetic field sensor of claim 2, wherein the AC magnetic field component sensor path is configured to receive the first sensor signal via a XMR sensor, and
wherein the DC magnetic field component sensor path is configured to receive the second sensor signal via a vertical Hall sensor.

11. A magnetic field sensor, comprising:
a first magnetic field component sensor path configured to output a first current signal based upon a received first sensor signal corresponding to a measured magnetic field component within a first frequency range;
a first amplifier configured to output a voltage signal based upon the first current signal such that the voltage signal corresponds to the measured magnetic field within the first frequency range; and
a direct current (DC) component rejection path configured to generate a DC component cancellation signal by performing an analog integration of a second current signal that is based upon one of (i) the first current signal, or (ii) the first sensor signal,
wherein the DC component cancellation signal is coupled to the first magnetic field component sensor path to at least partially cancel a DC component in one of (i) the first current signal, or (ii) the first sensor signal, that corresponds to the second current signal that was analog integrated.

12. The magnetic field sensor of claim 11, further comprising:
a second magnetic field component sensor path configured to output a third current signal based upon a second sensor signal corresponding to measured magnetic field within a second frequency range that is less than the first frequency range.

13. The magnetic field sensor of claim 12, wherein the first amplifier is configured to output the voltage signal based upon a summation of the first current signal and the third current signal such that the voltage signal corresponds to the measured magnetic field within the first frequency range and the measured magnetic field within the second frequency range.

14. The magnetic field sensor of claim 12, wherein the first magnetic field component sensor path is configured to receive the first sensor signal via one or more coil sensor elements, and
wherein the second magnetic field component sensor path is configured to receive the second sensor signal via one or more Hall sensor elements.

15. The magnetic field sensor of claim 11, wherein the DC component rejection path includes an input and an output, each of the input and the output of the DC component rejection path being coupled to different respective stages within the first magnetic field component sensor path.

16. The magnetic field sensor of claim 11, wherein the DC component rejection path includes an input and an output, each of the input and the output of the DC component rejection path being coupled to the same stage within the first magnetic field component sensor path.

17. The magnetic field sensor of claim 16, further comprising:
a second amplifier coupled to the first amplifier, the second amplifier being configured to receive the first sensor signal,
wherein the same stage within the first magnetic field component sensor path to which each of the input and the output of the DC component rejection path are coupled within the first magnetic field component sensor path comprises an input of the second amplifier.

18. The magnetic field sensor of claim 11, wherein the DC component rejection path comprises a second amplifier configured to perform the analog integration to generate a differential voltage signal as the DC component cancellation signal.

19. The magnetic field sensor of claim 18, wherein the DC component rejection path further comprises:
a transconductance integrator configured to convert the differential voltage signal to a differential current signal as the DC component cancellation signal.

20. The magnetic field sensor of claim 12, wherein the first magnetic field component sensor path is configured to receive the first sensor signal via a XMR sensor, and
wherein the second magnetic field component sensor path is configured to receive the second sensor signal via a vertical Hall sensor.

* * * * *